United States Patent
Carlson et al.

(10) Patent No.: US 8,149,582 B2
(45) Date of Patent: Apr. 3, 2012

(54) DETACHABLE MODULE SYSTEM

(75) Inventors: Brian Philip Carlson, Saint Paul, MN (US); William Martin Christensen, Hibbing, MN (US); Chris James Steep, Woodbury, MN (US); Ryan Jacob Urban, Mahtomedi, MN (US)

(73) Assignee: Ecolab Inc., St. Paul, MN (US)

( * ) Notice: Subject to any disclaimer, the term of this patent is extended or adjusted under 35 U.S.C. 154(b) by 753 days.

(21) Appl. No.: 12/260,574

(22) Filed: Oct. 29, 2008

(65) Prior Publication Data

US 2010/0103629 A1  Apr. 29, 2010

(51) Int. Cl.
    H05K 7/14      (2006.01)
(52) U.S. Cl. .......................... 361/731; 361/729; 361/733
(58) Field of Classification Search .................. 361/729, 361/731, 732, 733
    See application file for complete search history.

(56) References Cited

U.S. PATENT DOCUMENTS

| | | | |
|---|---|---|---|
| 2,967,267 A * | 1/1961 | Steinman et al. | 361/730 |
| 4,738,632 A * | 4/1988 | Schmidt et al. | 439/341 |
| 5,117,555 A | 6/1992 | Hunt et al. | |
| 5,249,979 A * | 10/1993 | Deinhardt et al. | 439/341 |
| 5,510,810 A * | 4/1996 | Nishijima et al. | 345/156 |
| 5,537,289 A | 7/1996 | Dahl | |
| 5,554,053 A | 9/1996 | Matthews | |
| 5,600,542 A | 2/1997 | Malgouires | |
| 5,677,830 A | 10/1997 | Nogas et al. | |
| 6,008,985 A * | 12/1999 | Lake et al. | 361/679.32 |
| 6,172,875 B1 * | 1/2001 | Suzuki et al. | 361/729 |
| 6,418,027 B1 * | 7/2002 | Suzuki et al. | 361/729 |
| 6,456,495 B1 * | 9/2002 | Wieloch et al. | 361/729 |
| 6,475,036 B2 * | 11/2002 | Morikawa | 439/716 |
| 6,780,045 B2 | 8/2004 | Shuey et al. | |
| 6,802,737 B2 * | 10/2004 | Bergner et al. | 439/532 |
| 6,916,194 B2 * | 7/2005 | Sichner et al. | 439/271 |
| 7,170,758 B1 | 1/2007 | Hanning et al. | |
| 7,239,521 B2 | 7/2007 | Quero et al. | |
| 7,329,137 B2 | 2/2008 | Martin et al. | |
| 7,331,802 B2 | 2/2008 | Rothermel et al. | |
| 2002/0142670 A1 | 10/2002 | Listing et al. | |

FOREIGN PATENT DOCUMENTS

DE    44 04012    8/1995
EP    0 878 876 A2    11/1998

OTHER PUBLICATIONS

International Search Report and Written Opinion of international application No. PCT/IB2009/054794, mailed Jun. 29, 2010, 9 pp.

* cited by examiner

Primary Examiner — Dameon Levi
(74) Attorney, Agent, or Firm — Shumaker & Sieffert, P.A.

(57) ABSTRACT

A detachable module system includes a plurality of modules that couple to a corresponding plurality of module mounts on a mounting plate. To install a selected module into the module system, a user translates the selected module to an engage position on its respective module mount to engage the selected module with a immediately preceding adjacent module. Any one of the modules may be identified and removed from its module mount, without requiring removal of the remaining modules. The modules may house various types of electronic devices.

27 Claims, 19 Drawing Sheets

DETACHABLE MODULE SYSTEM

TECHNICAL FIELD

The disclosure relates generally to housings and more particularly to a system of modular housings.

BACKGROUND

Certain applications require the use of electronic housings that enclose and protect electronic devices. Electronic housings may take on a wide variety of configurations depending upon the size and shape of the electronics to be housed, the application to which the electronic devices are directed, as well as the environment in which the devices will be used and other factors.

SUMMARY

In general, the disclosure relates to a detachable module system including a plurality of modules that couple to a respective one of a plurality of module mounts of a mounting plate. The modules are individually attachable and detachable from the module system. To install a selected module into the module system, a user translates the selected module to an engage position on its respective module mount to engage the selected module with a immediately preceding adjacent module. Any one of the modules may be identified and removed from its module mount without requiring removal of the remaining modules. The modules may house various types of electronic devices.

In one embodiment, the invention is directed to a system that includes a mounting plate including a plurality of module mounts arranged linearly from a proximal end of the mounting plate to a distal end of the mounting plate, and a plurality of modules, each configured to attach to any one of the plurality of module mounts, and each including a first module connector oriented toward the proximal end of the mounting plate and a second module connector oriented toward the distal end of the mounting plate when each module is attached to a module mount, wherein a first one of the plurality of modules attaches to a first one of the plurality of module mounts at the proximal end of the mounting plate, and a second one of the plurality of modules attaches to a second one of the plurality of module mounts distally adjacent to the first module mount such that the first module connector of the second module engages with the second module connector of the first module.

In another embodiment, the invention is directed to a method including attaching a first one of a plurality of modules to a first one of a plurality of module mounts linearly arranged on a mounting plate successively attaching each remaining one of the plurality of modules to a successively adjacent module mount, wherein successively attaching further comprises translating each remaining module toward a precedingly adjacent one of the plurality of modules such that each successive module is engaged with the precedingly adjacent one of the plurality of modules. The method may also include identifying one of the plurality of modules to be removed from the mounting plate translating modules on a removal side of the identified module to a disengage position relative to their respective module mounts, translating the identified module to a removal position relative to its respective module mount, and removing the identified module from its respective module mount. The method may also include reattaching the identified module to the module mount from which it was removed, and translating the modules on the removal side of the identified module to an engaged position relative to their respective module mounts. The method may also include attaching a new module to the module mount from which the identified module was removed, and translating the modules on the removal side of the identified module to an engaged position relative to their respective module mounts.

In another embodiment, the invention is directed to mounting plate comprising a plurality of module mounts attached together by a frangible tab and each having at least one insertion slot and at least one translation channel configured to accept one of a plurality of modules within the at least one insertion slot and allow the one of the plurality of modules to move within the at least one translation channel.

In another embodiment, the invention is directed to a module comprising a housing having a base that rests against a mounting plate, the mounting plate having at least one translation channel and at least one translation rail, at least one mounting bracket that extends from the base, retains the at least one translation rail and slides within the translation channel, a first module connector disposed on a first side of the module housing, and a second module connector disposed on a second side of the module housing, wherein the first module connector is sized to engage with the second module connector of an adjacent module mounted to the mounting plate.

The details of one or more embodiments of the invention are set forth in the accompanying drawings and the description below. Other features of the invention will be apparent from the description and drawings, and from the claims.

DETAILED DESCRIPTION

A detachable module system provides for installation of multiple modular electronics housings that are individually attachable and detachable from the module system. The modules may be used to house various types of electronic devices. The modules may include connectors that physically and/or communicatively connect each module to one or more adjacent modules. One of the modules may be a base/control module that controls and/or monitors communications from the other modules via electrical communication made possible by the connection of each module to adjacent modules.

The detachable module system includes a mounting plate that is attached to a substrate, such as a wall or other relatively stationary surface. The mounting plate may include multiple module mounts connected with frangible tabs so that unnecessary module mounts may be removed from the mounting plate. Each module may be individually coupled to any module mount of the mounting plate. In addition, each module may be detached from the module system without removing any of the other modules from the mounting plate.

In certain applications, liquid products or other materials are dispensed or delivered from a material source to a delivery site via a delivery tube, e.g., a hose or a line. Each delivery tube may be mounted to a wall or other stationary substrate that allows the delivery tube to remain out of the way of personnel or other equipment and run through a common available area. In addition, mounting of the delivery tube to a substrate may allow a device to control or detect the material within the delivery tube. For example, each of multiple delivery tubes may feed into a separate valve mounted on the wall above the delivery site before the delivery tube continues to the delivery site. The valves for multiple delivery tubes may then be located in a similar area that decreases maintenance time of an operator. These types of systems can be found in many applications from manufacturing plants to food service.

Each module in the detachable module system may house an electronic device. The electronic device may include, for example, a sensor that detects presence and/or absence of fluid within the delivery line associated with the module. The device may allow for remote monitoring of fluid dispensing systems such as those that may be found in commercial laundries, restaurants, food processing plants, or other applications. However, the detachable modules may also be appropriate for numerous other applications. For example, the detachable module system may be used in heating, ventilation and cooling systems, electrical systems, food and beverage systems, health care systems, automotive applications, vehicle maintenance systems, water purification systems, sanitation systems, fast food restaurant systems, pest elimination systems, construction systems, manufacturing systems, entertainment systems, or any other field in which a detachable modular system may be appropriate.

Figure 1:
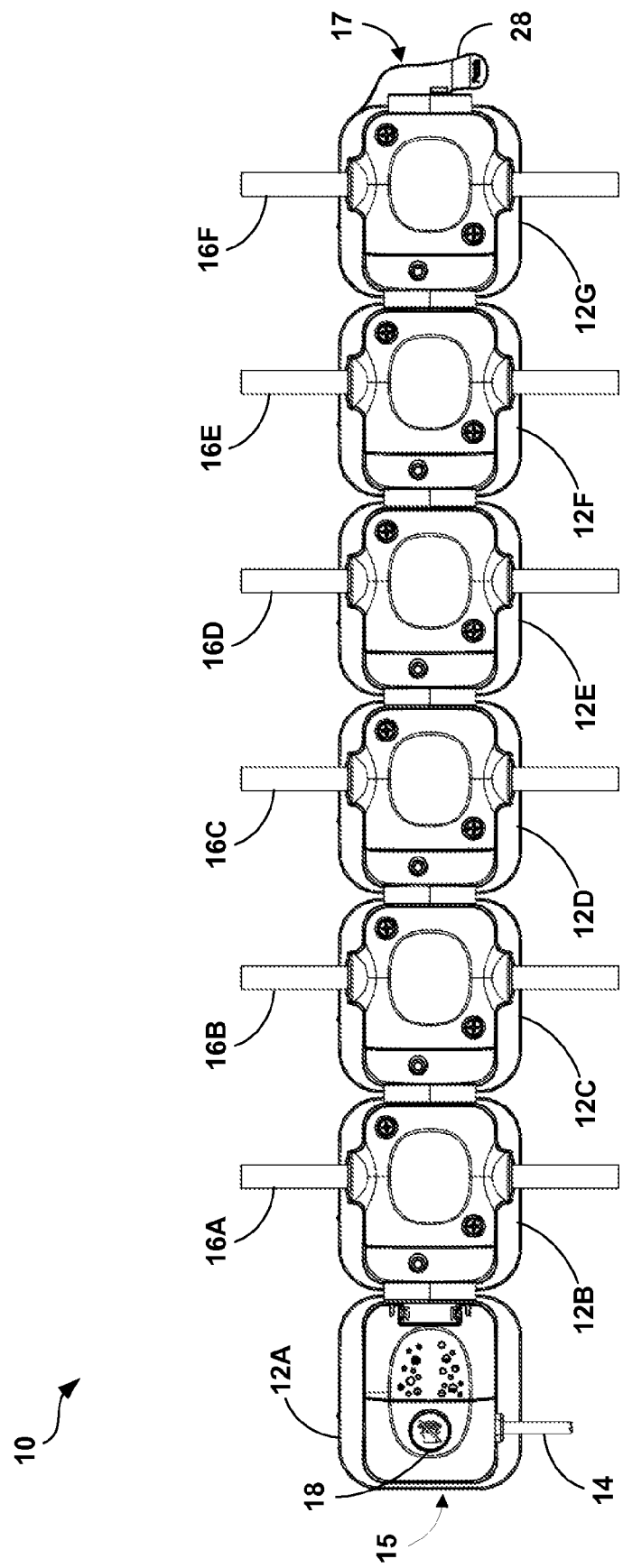
FIG. 1 is a conceptual diagram illustrating a front view of a detachable module system that includes a set of modules coupled to a mounting plate.

FIG. 1 is a conceptual diagram illustrating a front view of an example detachable module system 10 that includes a set of modules 12A-12G coupled to a mounting plate. In the example system of FIG. 1, system 10 includes a plurality of modules 12A, 12B, 12C, 12D, 12E, 12F, and 12G (collectively "modules 12") each associated with a different one of a plurality of fluid delivery lines 16A, 16B, 16C, 16D, 16E, and 16F (collectively "delivery lines 16").

Module system 10 includes a proximal end 15 and a distal end 17 that are so labeled for purposes of description only. In this example, a base module 12A is located at a proximal end 15 of the module system 10. Base module 12A may, in some applications, be a base/control module that monitors and/or controls the function of electronic devices housed in the other modules 12. Base module 12A may include a cable 14 that provides electrical power and/or communications with external devices. Base module 12A may also include and a mute button 18 for muting an audible alert, such as an out-of-product alarm or other audible alert relevant to the particular application.

Base module 12A is so named because, in the example shown in FIG. 1, base module 12A is typically installed first at the proximal-most position along module system 10. The remaining modules 12B-12G are then installed successively (e.g., in order from 12B to 12G) until the final module 12G is installed in the distal-most position along the module system 10. A locking tab 28 at the distal end 17 of module system 10 maintains modules 12 in an engaged position when all of the modules 12A-12G have been installed.

In this example, module system 10 houses electronic sensors that monitor fluid delivery lines 16 for the presence or absence of a fluid product. It shall be understood, however, that module system 10 may be used to house any other type of electronic sensor or device. System 10 is typically mounted to a substrate, such as a wall or other relatively stationary surface and fluid product is dispensed through delivery lines 16 en route to individual dispensing sites. If any of modules 12 detect that fluid is not present within the respective delivery line 16, an out-of-product alert may be generated. The out-of-product alert may be a local visual or audible alert, or may be an electronic communication that is remotely sent to an external device such as a networked computer, cell phone, personal digital assistant, pager, or other communication device via e-mail, voice mail, text message, page, etc.

Although system 10 is shown as having seven modules 12 that includes one base/control module 12A, it shall be understood that system 10 may include any number of modules 12 in other examples, and that the invention is not limited in this respect. System 10 may be modified to include as few as one module 12 or as many modules as needed for the intended application, e.g., more than twenty or even more than one hundred. In other examples, system 10 may include more than one base/control module 12A or no control modules if control of the other modules 12 is not required. Base/control module 12A may be located at the proximal end 15 of module system 10, at the distal end 17 of module system 10 or somewhere in the middle of system 10 depending upon the particular application, or for convenience. In addition, although in this example each of the modules 12 are described as housing the same type of electronic device, modules 12 need not all house the same type of device, and some or all of the modules 12 may house different types of devices.

Also in this example, each of modules 12 is described as housing the same type of sensor; in this case, an out-of-product sensor that monitors delivery lines 16 for presence/ absence of a fluid. However, modules 12 may be configured to house different types of sensors, which may then perform different tasks in either serially or in parallel. In the parallel technique, the fluid may be split from one main line into multiple delivery lines 16 so that the sensors within each module 12 may monitor a different characteristic of the fluid, e.g., out-of-product, flow rate, density, temperature, and pressure. Alternatively, a serial technique may provide that the same material flows through module 12B and consecutively through the other modules. Delivery line 16A may loop back to delivery line 16B such that the material has to pass through each module 12. Each module 12 may manage the material, e.g., pump, direct, treat, heat, cool, or pressurize, or monitor some aspect of the material, e.g., out-of-product, flow rate, density, temperature, and pressure.

Modules 12 may be installed in system 10 without the need of tools. For example, a module 12 may be inserted into a slot in the mounting plate to couple the module to the mounting plate. The module 12 may then be translated along the mounting plate toward a immediately preceding adjacent module to engage the module 12 with the immediately preceding adjacent module. Installation of modules 12 may thus be accomplished without the need for tools or specific training. Installation of modules 12 will be described in further detail herein.

In addition, each of modules 12 may be separately detachable from system 10 without removing the remaining modules. For example, module 12D may be removed from system 10 without removing any other module 12 from system 10. As will be described in further detail below, modules 12 are configured to slide or translate within the module mounts of the mounting plate (not shown in FIG. 1) to allow removal of one or more modules 12 without requiring removal of the remaining modules.

The dimensions of each module 12 and of the system 10 may vary depending upon the application. For example, each module 12 may have a width generally between 1.0 centimeter (cm) and 100 cm, a height generally between 1.0 cm and 100 cm, and a depth between 1.0 cm and 100 cm. More specifically, each module 12 may have a width between 5 cm and 15 cm, a height between 4 cm and 14 cm, and a depth between 4 cm and 14 cm. In an example, embodiment, each module 12 may have a width of approximately 10 cm, a high of approximately 9 cm, and a depth of approximately 8 cm. It shall be understood, however, that the specific dimensions of the modules 12 and the system 10m as a whole may vary depending upon the type of sensor housed by the module, the dimensions of the delivery tubes 16, the specific needs of the application, as well as other factors, and that the invention is not limited in this respect.

Although system 10 is shown as a substantially linear assembly of modules 12, system 10 may be configured to a different shape. For example, system 10 may be curved within the plane of the substrate to which system 10 is mounted or allowed to be mounted to a curved substrate. In any case, it shall be understood that system 10 may take the form of different shapes and size than those described herein.

Figure 2:
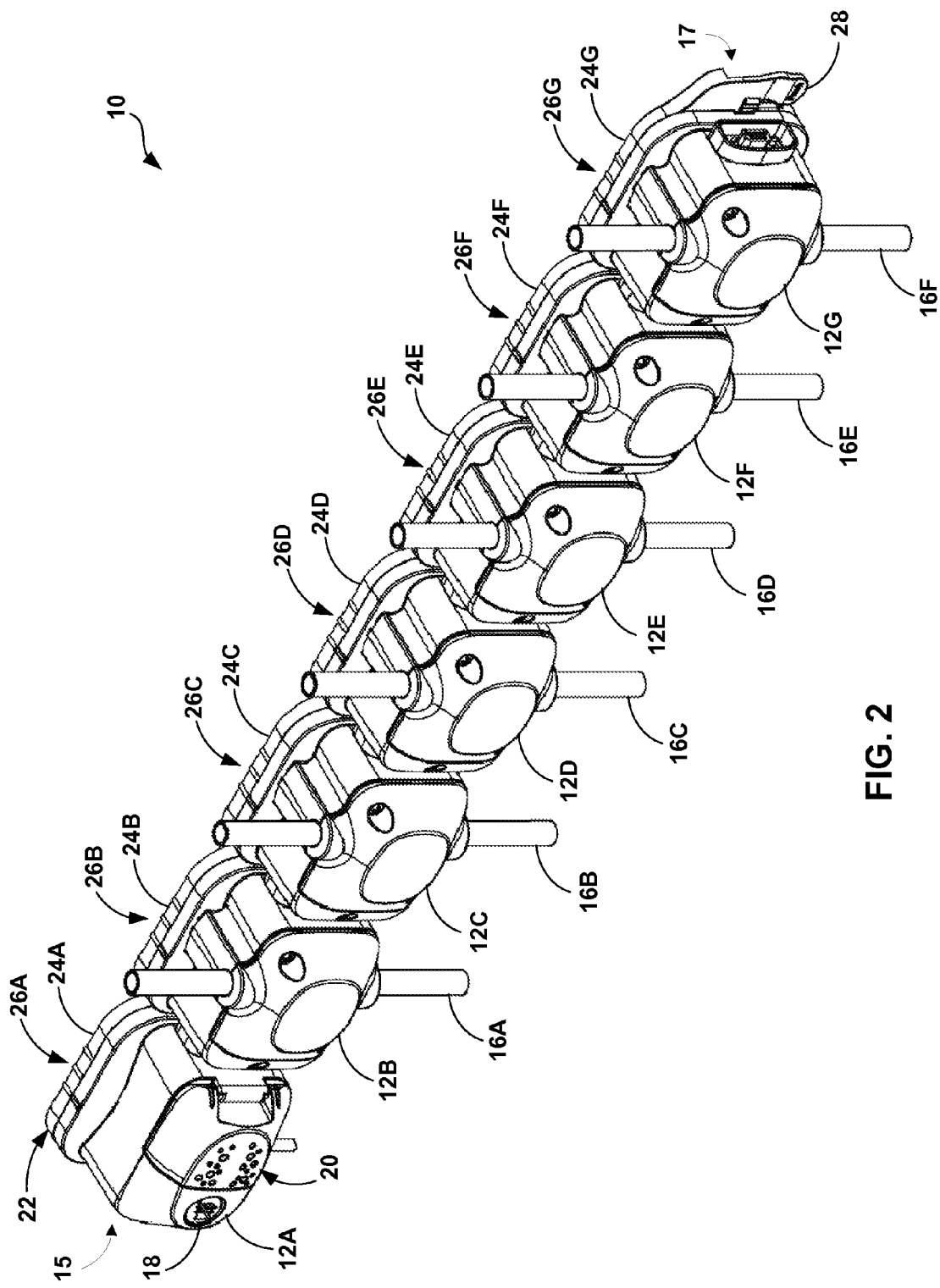
FIG. 2 is a conceptual diagram illustrating a front perspective view of a detachable module system that includes a plurality of modules coupled to a mounting plate having a plurality of module mounts.

FIG. 2 is a conceptual diagram illustrating a front perspective view of a detachable module system 10 that includes a plurality of modules 12 each associated with one of a plurality of delivery lines 16. System 10 also includes a mounting plate 22 having a plurality of module mounts 24A, 24B, 24C, 24D, 24E, 24F, and 24G (collectively "module mounts 24") each of which couples to a respective one of modules 12. Module mounts 24 may be attached to each other by frangible tabs (not shown) that allow for removal or breaking off of unnecessary module mounts 24 when the particular installation does not call for them.

As described above, base/control module 12A may control the function of electronic devices within each of modules 12. To that end, each of modules 12 may allow the devices housed therein to be communitively coupled to the device(s) in the adjacent module(s). Each of the modules 12 may also include a hinged or removable housing cover that opens to allow the user to access the electronics housed within the module 12.

Mounting plate 22 includes a plurality of module mounts 24. In use, mounting plate 22 is attached to a substrate (not shown) to provide a secure position on which to mount the modules 12. Mounting plate 22 may be attached to the substrate with multiple screws, multiple nails, adhesives, or any other fastening device appropriate for the type of substrate to which mounting plate 22 will be attached. Although each module mount 24 may be attached to the substrate, not all module mounts 24 may need to be attached because the mounting plate 22 may only need minimal fasteners to securely attach mounting plate 22 to the substrate.

Each module mount 24 may also include a respective set of alignment indicators 26A, 26B, 26C, 26D, 26E, 26F, and 26G (collectively "alignment indicators 26") that indicate the relative position of each module 12 with respect to the module mount 24. Alignment indicators 26 may include, for example, an engage position, a removal position, and a disconnect position. The engage position indicates that module 12 is engaged to the adjacent module 12, the removal position indicates that module 12 may be removed from the respective module mount 24, and the disconnect position indicates that the module 12 is moved far enough to allow the adjacent disconnected module to be removed from its module mount 24. The engage, removal, and disconnect positions will be described in more detail below with respect to FIGS. 14 and 15, for example.

Mounting plate 22 may also include locking tab 28 on the distal-most module mount, which in this example is module mount 24G. Locking tab 28 includes teeth that allow the distal-most module, in this example module 12G, to ratchet into place and remain in the engaged position with module 12F without allowing module 12G to slide away from (in this case, in the distal direction) and possibly disconnect from module 12F. The teeth of locking tab 28 allow for slight variations in module 12 sizes and/or variability during installation of the modules. To remove a module, a user may depress locking tab 28 to release module 12G which may then be translated away from module 12F to the removal position or disconnect position. Although in this example locking tab 28 is described as having teeth, locking tab 28 may employ any of a number of different locking mechanisms, and the invention is not limited in this respect.

Mounting plate 22 and modules 12 may be constructed of any number of materials commonly used in the art. For example, mounting plate 22 and/or modules 12 may be constructed of a polymer, a composite material, a metal alloy, or any other material. Example polymers include polypropylene, polyethylene, polyurethane, polystyrene, and nylon, and others known to those of skill in the art. Mounting plate 22, module mounts 24, or modules 12 may also be constructed of a combination of any materials. It shall be understood, however, that mounting plate 22 and modules 12 may be constructed of any appropriate material, and that the invention is not limited in this respect.

Figure 3:
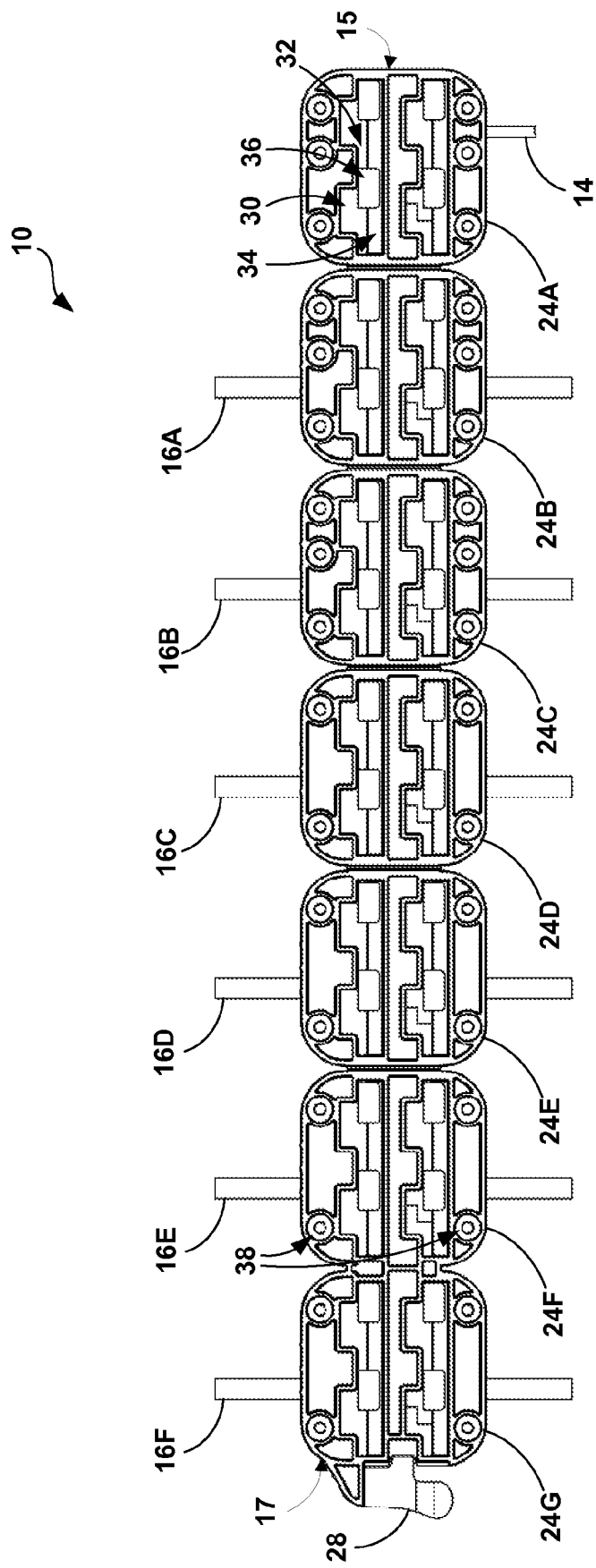
FIG. 3 is a conceptual diagram illustrating a back view of a plurality of modules coupled to a mounting plate having a plurality of module mounts.

FIG. 3 is a conceptual diagram illustrating a back view of a module system 10 including plurality of modules 12 coupled to a plurality of module mounts 24. As shown in FIG. 3, each of modules 12 are coupled to their respective module mounts 24 and physically connected, or engaged, to their adjacent modules. In this example, each of module mounts 24 includes four mounting holes 38 that accept a screw used to attach the module mounts 24 to a substrate, such as a wall. It shall be readily apparent that any number of mounting holes may be used depending upon the size, shape and installation requirements of the modules, and that it may not be necessary to use all mounting holes 38 when attaching system 10 to the substrate.

Each module mount includes at least one insertion slot 30, a translation rail 34 and a translation channel 32. To couple a module 12 into a module mount 24, a mounting bracket 36 of a module 12 is inserted into the insertion slot 30 and over translation rail 34. Module 12 is then slid, or translated along translation rail 34 in an engagement direction. The engagement direction is described herein as the direction in which to slide, or translate, a module such that is engages with a immediately preceding adjacent module. In this example, the engagement direction is toward the immediately preceding adjacent module. In this example, the engagement direction corresponds to the proximal direction 15 because modules are installed from the proximal to the distal end. As each module 12 is successively added to the mounting plate, translating of the each module toward the immediately preceding adjacent module results in engagement of the module with the immediately preceding adjacent module as described herein below.

In this example, module mounts 24 are shown to include four insertion slots 30, two translation rails 34, and two translation channels 32 to accommodate the example module 12 which includes four mounting brackets 36. However, module mounts 24 may only require one insertion slot, one translation rail, and one translation channel to accommodate one mounting bracket of the associated module 12. Any number of insertion slots, translation rails, translation channels, and mounting brackets may be employed by systems 10 as long as modules 12 are capable of coupling to their respective module mounts 24. Although mounting bracket 36 is shown resting on top of translation rail 34, system 10 may be constructed or implemented such that mounting bracket 36 couples to translation rail 34 by moving up and resting underneath translation rail 34. In this manner, system 10 may be attached to the substrate without regard to an upright, an upside-down, or a sideways configuration. System 10 may function in any orientation with respect to gravity.

In the example of FIG. 3, the engagement direction is generally linear. In other examples, the engagement direction need not be linear. For example, the engagement direction may follow a curved path, or a rotation, that couples the module to the module mount. In this example, mounting brackets of a module may be inserted straight into insertion slots of the module mount and turned in a direction to move the mounting brackets around a circular translation rail until the mounting brackets grasp the translation rail. Also, the module may engage to the adjacent module when turned in the engagement direction. This and other alternatives are contemplated in this disclosure.

When module mounts 24 are attached to the substrate, the back of each module mount 24 are not accessible to the user. This inaccessibly may prevent tampering with system 10 by an unauthorized user. However, other examples of system 10 may allow the back of module mounts 24 to be accessible in order for ease of maintenance or out of necessity due to the substrate to which module mounts 24 are mounted.

Figure 4:
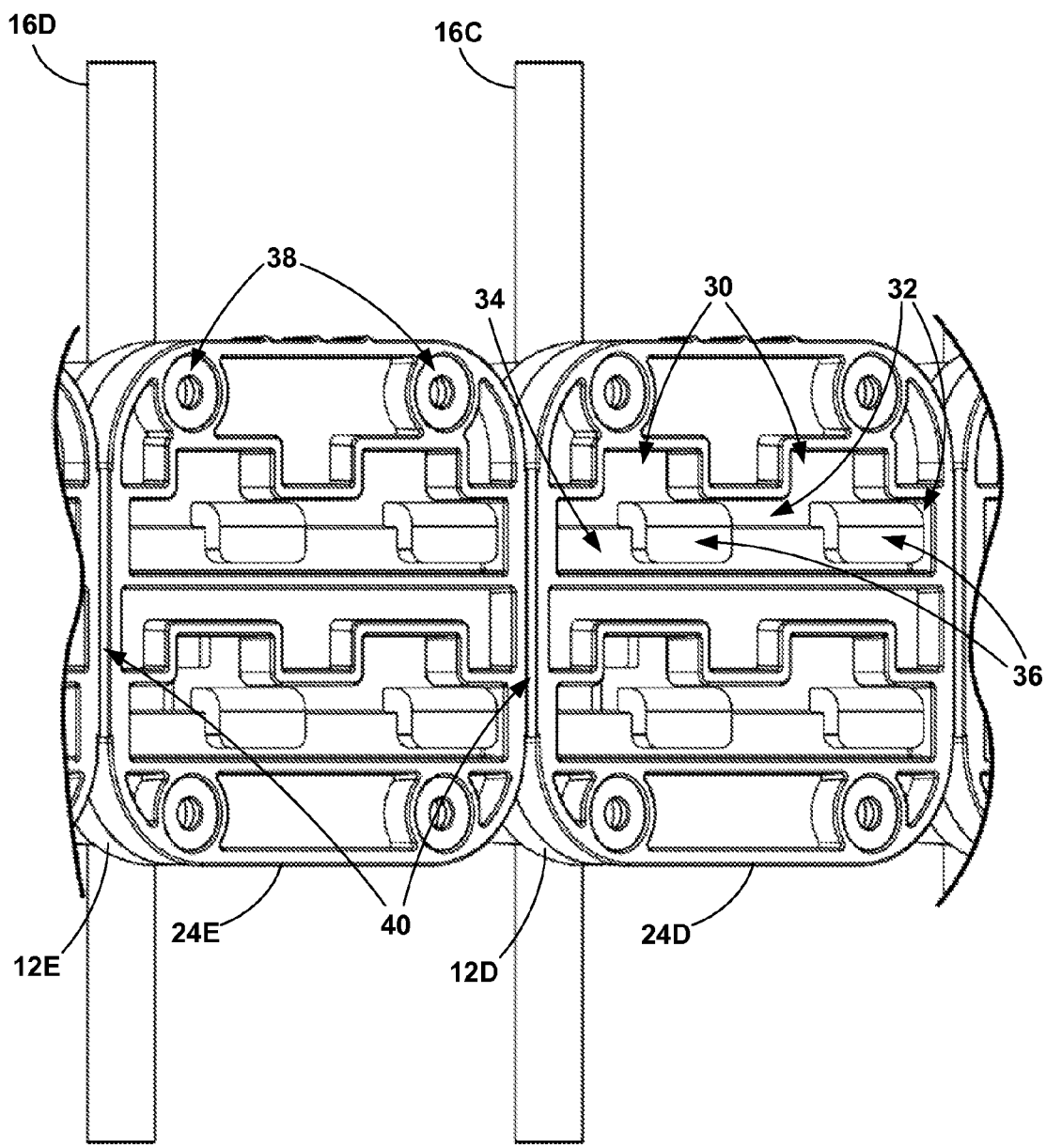
FIG. 4 is a conceptual diagram illustrating a back perspective view of example modules coupled to example module mounts.

FIG. 4 is a conceptual diagram illustrating a back perspective view of example modules 12D and 12E coupled to respective module mounts 24D and 24E. As shown in FIG. 4, mounting brackets 36 of modules 12 are coupled to translation rails 34 within translation channels 32 of module mounts 24. In this position, modules 12 are in the engaged position.

Insertion slots 30 are configured to allow the passage of mounting brackets 36 through the surface of module mounts 24.

Each module mount 24 also includes a plurality of mounting holes 38 through which fasteners pass to attach the module mounts 24 to the substrate. In some examples, not all mounting holes 38 will be used to attach module mounts 24 to the substrate. In addition, module mounts 24 are attached to each other via frangible tabs 40 along the sides of the module mounts 24. Mounting plate 22 may be constructed with a certain number of module mounts 24, e.g., seven module mounts 24. If only five modules 12 are needed, for example, the user may break off the unneeded module mounts 24 along the appropriate frangible tab 40. Frangible tabs 40 are frangible joints that may be constructed of a thickness and hardness such that a user is able to separate module mounts 24 from each other by bending mounting plate 22 at the desired frangible tab 40. In other examples, the user may need to use a tool to cut frangible tabs 40. In any case, frangible tabs 40 shall sufficiently attach all module mounts 24 without premature or unwanted breakage.

In other examples, module mounts 24 may be attached with a coupling element or other fastener to create mounting plate 22. In some additional examples, module mounts 24 may be individually attached to the substrate adjacent each other. Alternatively, module mounts 24 may be attached to a base plate or mounting rail as needed prior to coupling modules 12 to the respective module mounts 24.

Figure 5:
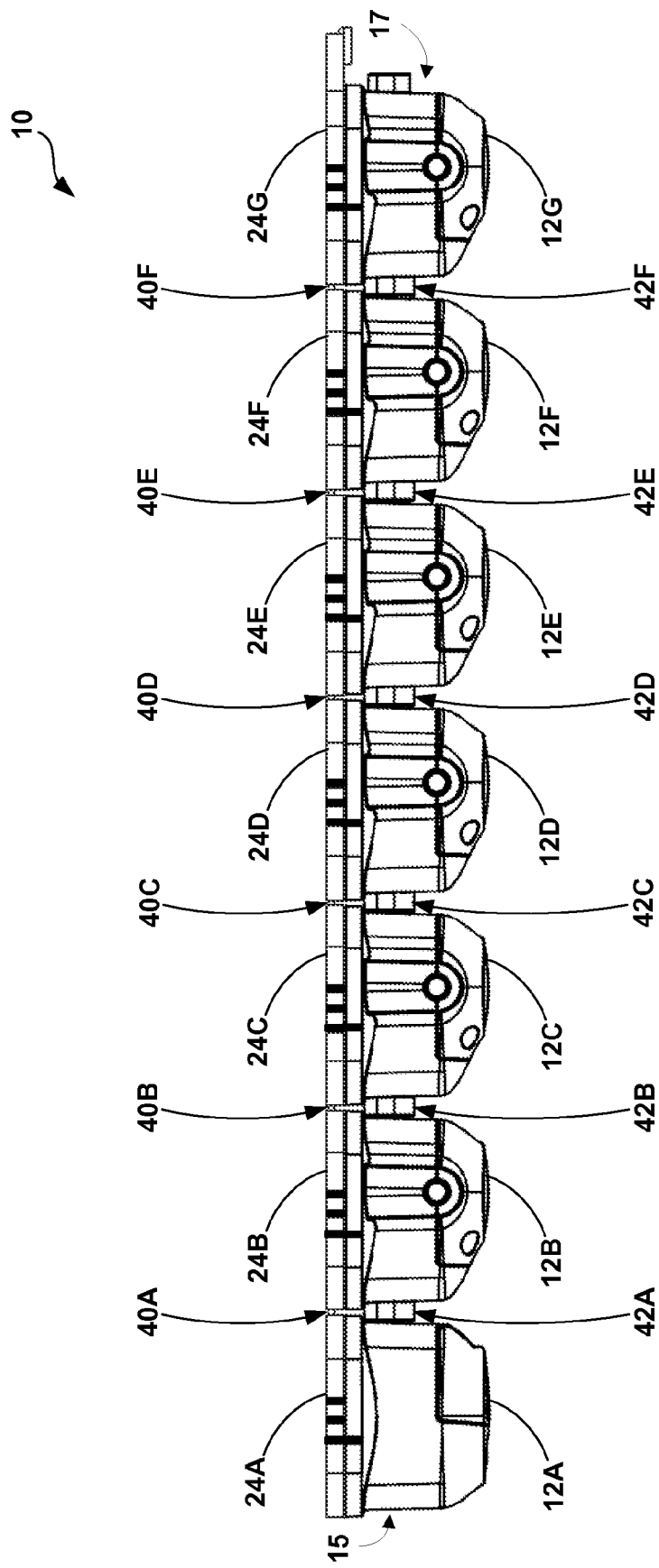
FIG. 5 is a conceptual diagram illustrating a top view of a detachable module system that includes a plurality of modules coupled to a mounting plate.

FIG. 5 is a conceptual diagram illustrating a top view of a detachable module system 10 that includes a plurality of modules 12 coupled to module mounts 24 of mounting plate 22. As shown in FIG. 5, modules 12 are coupled to their respectively module mounts 12. Module mounts 24 are attached to each other via frangible tabs 40A, 40B, 40C, 40D, 40E, and 40F (collectively "frangible tabs 40"). In addition, modules 12 are electrically engaged, or coupled, to each other via module connections 42A, 42B, 42C, 42D, 42E, and 42F (collectively "module connections 42").

Module connections 42 each include a first module connector and a second module connector (one example of which is described in further detail with respect to FIGS. 9-12). Module connections 42 may aid in the alignment of adjacent modules 12 during engagement. The first module connector of one module fits with the second module connector of an adjacent module to physically engage the two modules. The engagement of the first module connector with the second module connector may create a weather resistant or weather proof seal that protects the electrical connections within each module 12. However, module connections 42 may not be resistant to fluids or gasses in other examples. Alternatively, module connections 42 may have equally sized connectors that do not fit within one another. In some other examples, module connections 42 may simply be an electrical connection that is not covered by a portion of modules 12.

Figure 6:
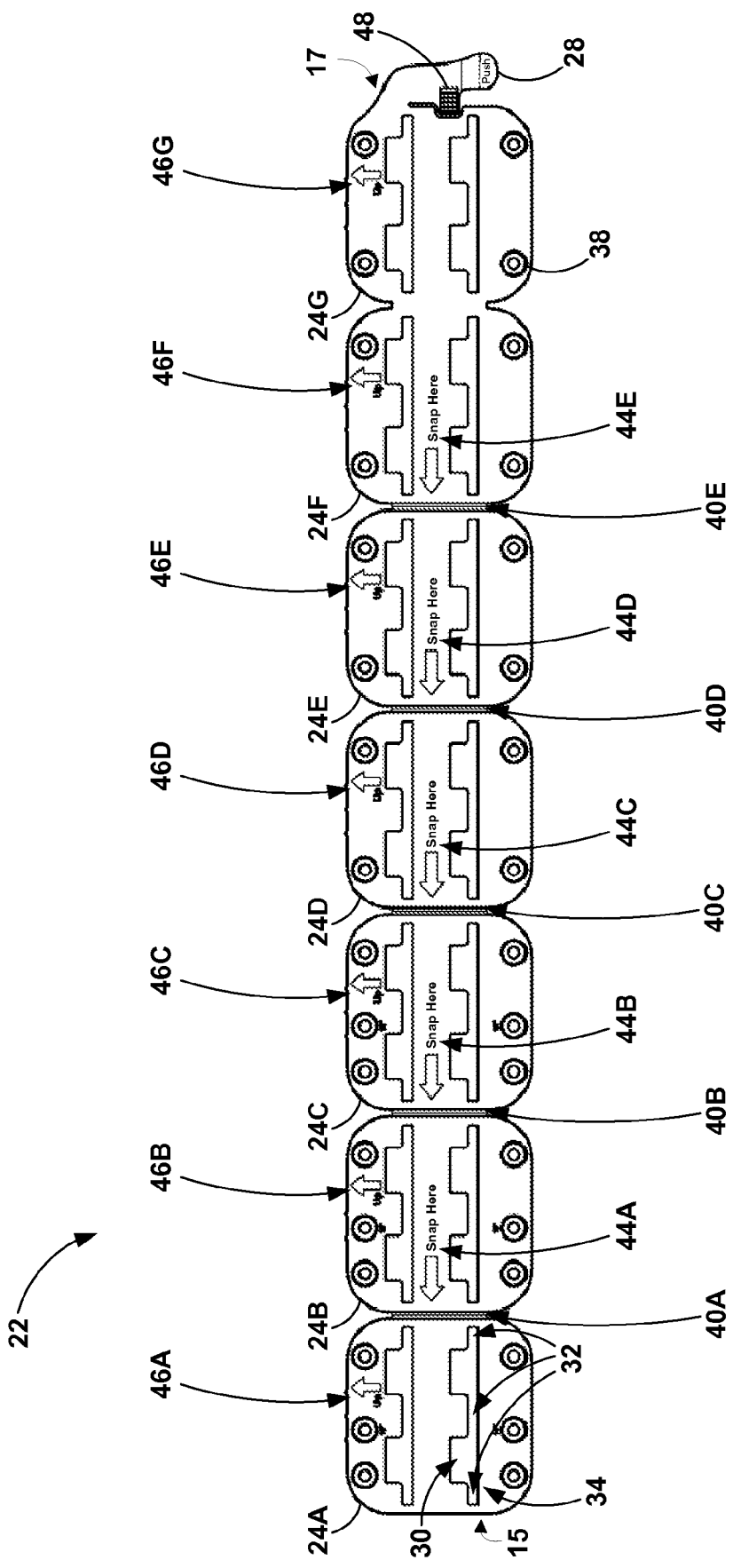
FIG. 6 is a conceptual diagram illustrating a front view of an example mounting plate and elements of each module mount of the mounting plate.

FIG. 6 is a conceptual diagram illustrating a front view of an example mounting plate 22 and elements of each module mount 24 of mounting plate 22. As shown in FIG. 6, mounting plate 22 includes seven module mounts 24. In this example, the first module mount 24A at the proximal end 15 of the mounting plate 22 would be where the base/control module, if any, would be connected. An distal end module mount (in this case module mount 24G) includes locking tab 28 at the distal end 17 of the mounting plate 22. Frangible tabs 40A-40E attach each module mount 24, with the exception of module mount 24F and end module mount 24G that may be molded together as shown in this example. Each module mount 24 includes insertion slots 30, translation rails 34, and translation channels 32. The front surface of module mounts 24 may be substantially smooth to allow module 12 to easily slide across the front surface.

Module mounts 24 may include break instructions 44A, 44B, 44C, 44D, and 44E (collectively "break instructions 44"). Break instructions 44 may include an indicia, such as an arrow pointing to the appropriate frangible tab 40 and words including "snap here," to indicate to the user how to separate unneeded module mounts 24. Module mounts 24 may also include mount instructions 46A, 46B, 46C, 46D, 46E, 46F, and 46G (collectively "mount instructions 46"). Mount instructions 46 may include an indicia, such as an arrow, pointing to the "up" orientation of module mounts 24. Break instructions 44 and mount instructions 46 may be molded into module mounts 24, applied via a decal, printed, or otherwise created on each module mount 24.

Figure 7:
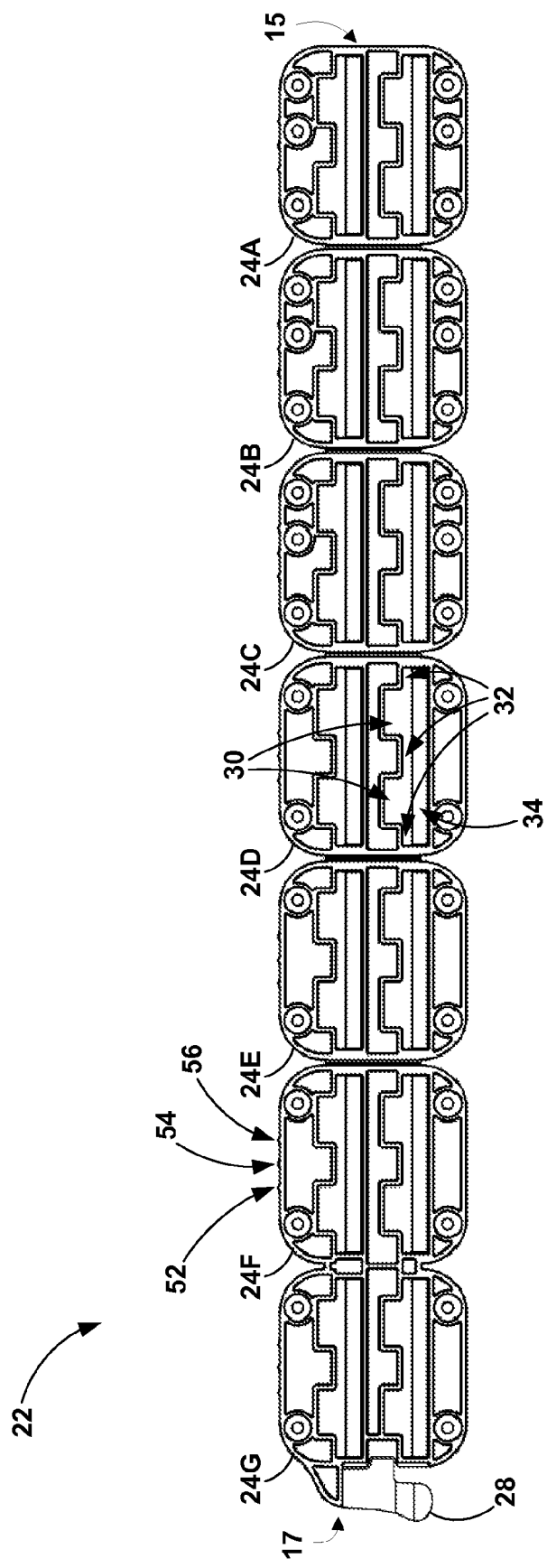
FIG. 7 is a conceptual diagram illustrating a back view of an example mounting plate having multiple module mounts.

FIG. 7 is a conceptual diagram illustrating a back view of an example mounting plate 22 having multiple module mounts 24. Because this is a back view, distal side 17 is shown in the left and proximal side 15 is shown on the right. As shown in FIG. 7, module mounts 24 include insertion slots 30, translation rails 34, and translation channels 32. In addition, module mounts 24 may each include alignment indicators that allow the user to know when a module is in a particular position relative to its respective module mount 24. The alignment indicators include engage position indicator 56, removal position indicator 54, and disconnect position indicator 52. Engage position indicator 56 indicates that a module 12 is engaged to the immediately preceding adjacent module 12. Removal position indicator 54 indicates that module 12 may be removed from its respective module mount 24. Removal position indicator 54 is also the position in which each module 12 is initially inserted into the respective module mount 24. Disconnect position indicator 52 indicates that the module 12 is moved far enough to allow the adjacent disconnected module to be removed from its module mount 24. Each module 12 includes a position indicator that aligns with one of the alignment indicators of module mounts 24 depending upon the current position of the module 12 with respect to the module mount 24.

Figure 8:
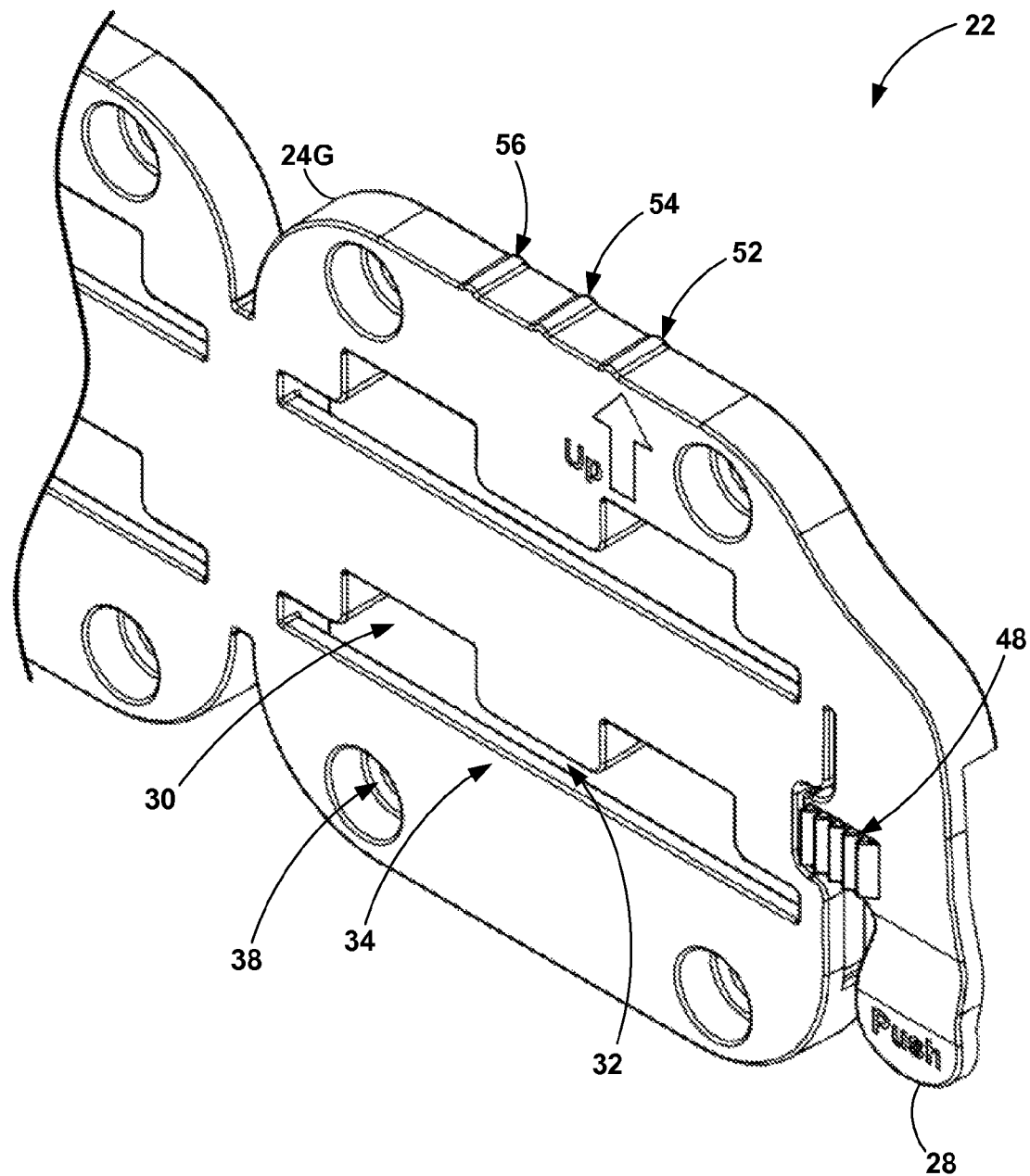
FIG. 8 is a conceptual diagram illustrating a front perspective view of an example end module mount of a mounting plate having a locking tab.

FIG. 8 is a conceptual diagram illustrating a front perspective view of an example end module mount 24G of mounting plate 22. (Although in this example, the end module mount is numbered 24G, it shall be understood that any number of module mounts may be used.) As shown in FIG. 8, end module mount 24G includes insertion slots 30, translation rails 34, translation channels 32, and locking tab 28. Translation rail 34 is configured with a thickness less than the opening of the mounting brackets of modules 12. Mounting holes 38 are also provided to attach module mount 24G to a substrate. Module mount 24G also includes engage position indicator 56, removal position indicator 54, and disconnect position indicator 52 to indicate where module 12 is positioned with respect to module mount 24G.

In this example, locking tab 28 is shown on the end of module mount 24G. In this example, locking tab 28 is an extended lever that is configured to flex toward the back of module mount 24G when depressed by a user. When locking tab 28 is depressed and moved backwards, teeth 48 are moved below the front surface of module mount 24G. The respective module mounting on end module mount 24G is then free to slide along translation rails 34 to disconnect position 52 when locking tab 28 is depressed and teeth 48 are moved away from module 12. Conversely, teeth 48 are a part of a ratcheting mechanism that retains module 12 in the engage position 56 when locking tab 28 is not depressed.

In other embodiments, module 12 may be locked to module mount 24G in a different manner. For example, a lever may be rotated over the end of the module to retain the module. In another example, a pin may be placed along side of the coupled module 12 within a hole in module mount 24G. Alternatively, module 12 may not be locked or retained by any mechanism. The engagement of modules 12 to each other may be sufficient to keep all modules 12 engaged.

Figure 9:
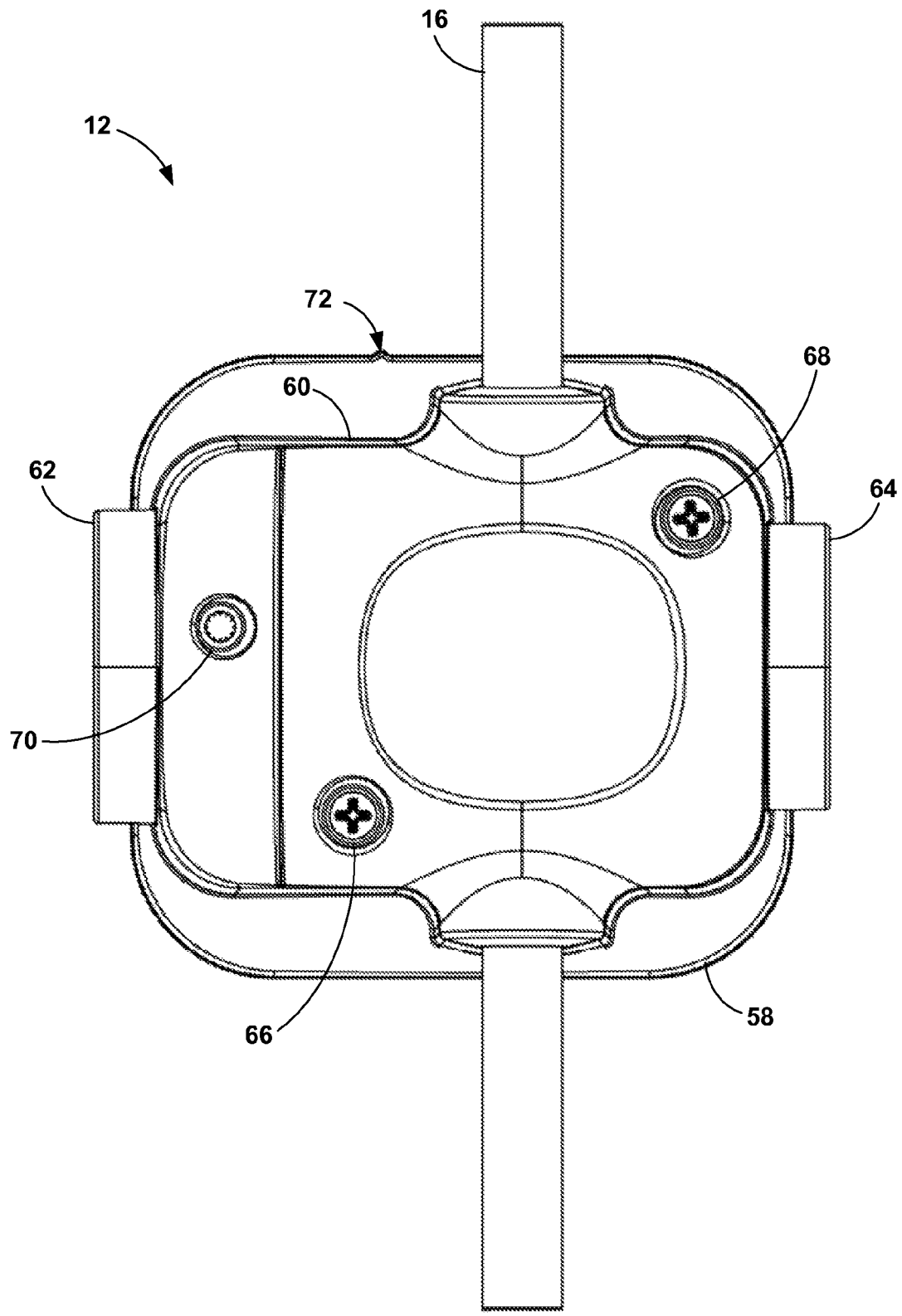
FIG. 9 is a conceptual diagram illustrating a front view of an example module.

FIG. 9 is a conceptual diagram illustrating a front view of an example module 12. As shown in FIG. 9, module 12 may be associated with delivery line 12 through which a fluid or other material passes. Module 12 includes a base 58 and a housing 60. In this example, housing 60 includes a first module connector 62 on one side of module 12 and a second module connector 64 on the opposite side of housing 60. Housing 60 is attached to base 58 via screws 66 and 68. One or more indicator(s) 70, such as a light emitting diode (LED) or other visual indicator, may indicate various status parameters of the device contained within housing 60. For example, when the device is an out-of-product sensor, indicator 70 may be activated when the sensor detects absence of a product within delivery line 12. As another example, indicator 70 may alert a user or service technician to a malfunction or otherwise indicate the status of the device. Base 58 also includes position indicator 72 that aligns with any of engage position indicator 56, removal position indicator 54, and disconnect position indicator 52 of the respective module mount 24 depending upon their relative position. In this example, delivery line 16 simply passes through module 12 and does not form a part of module 12, but is shown for illustrative purposes only.

In this example, housing 60 is configured to house a device to interact with the external material in delivery line 16. It need not interact with an external material, however. Housing 60 may be completely removed when unscrewing screws 66 and 68 or allowed to open on a hinge (not shown). Housing 60 may be opened while module 12 is coupled to the respective module mount 24. The device within housing 60 of module 12 may be any type of device desired by the user to interact with the external material, or other type of device that does not interact with an external material, depending upon the application. For example, the device may be an optical sensor that optically senses a parameter of the material, a mechanical sensor that senses a mechanical property of the material, or a chemical sensor that senses a chemical property of the material. In other examples, the device may be a treatment system that treats the material or a heat exchanger that heats or cools the material. Alternatively, the device may be a pump to move or pressurize the material, a valve to adjust the flow of the material, a mixer to mix the material, or a filter to filter particulates from the material. It shall be understood, therefore, that although in this example the detachable modules are shown and described with respect to an out of product sensor for detecting presence/absence of fluid within a fluid delivery line, the detachable modules may be used with any type of device in which several devices (whether electronic or otherwise, whether the devices are alike or different) are to be housed in adjacent modules and in which the flexibility provided by the detachable modules would be desirable.

Figure 10:
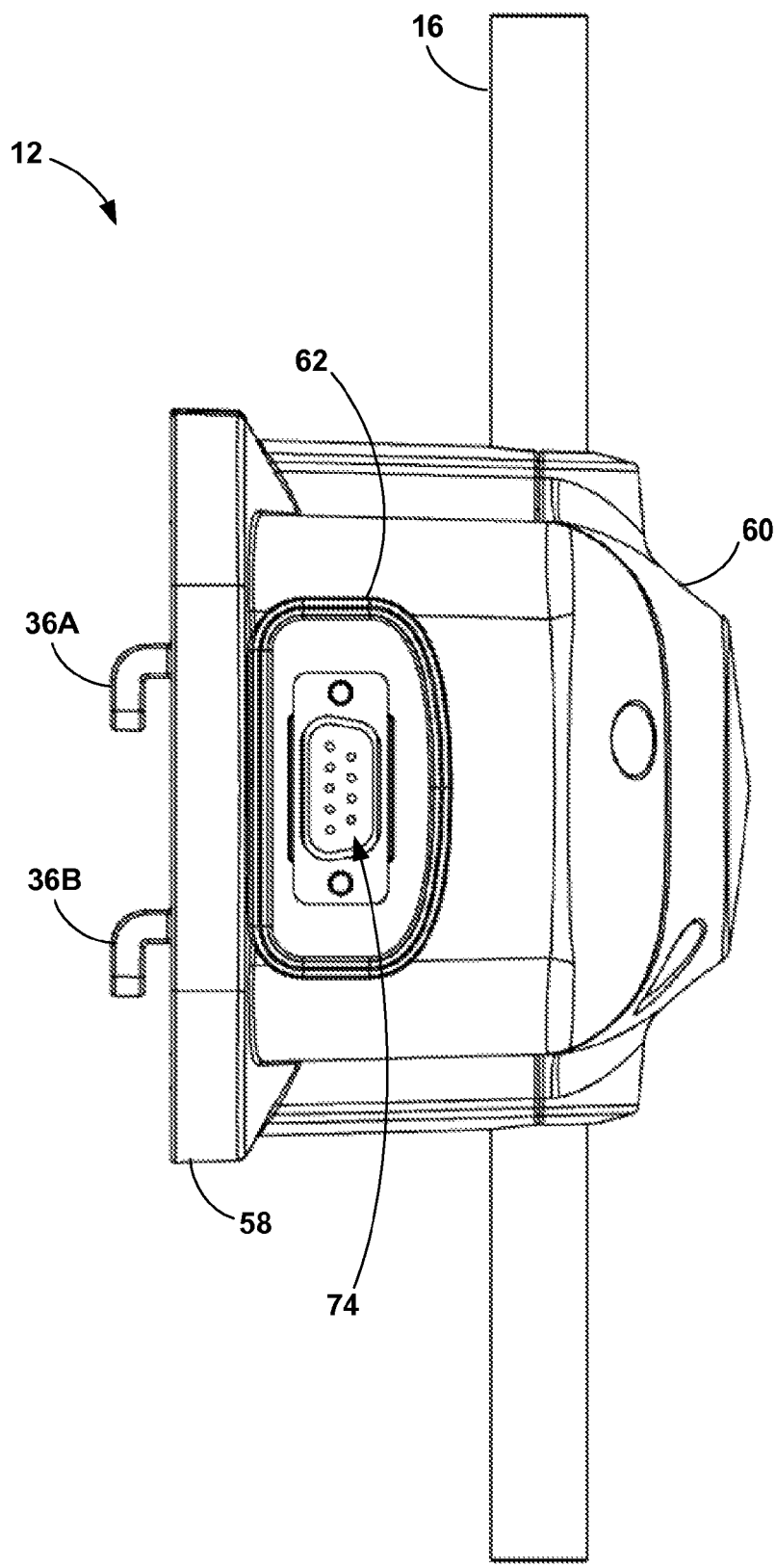
FIG. 10 is a conceptual diagram illustrating a left view of an example module with mounting brackets.

FIG. 10 is a conceptual diagram illustrating a left side view of an example module 12 with mounting brackets 36. As shown in FIG. 10, module 12 includes base 58, housing 60, proximal side coupling 62, and mounting brackets 36A and 36B (collectively "mounting brackets 36"). A first electrical connector 74 is a part of the electronic device housed within the module 12 and resides within proximal side coupling 62. First electrical connector 74 engages with a second electrical connector within a second module connector of the adjacent module 12. First electrical connector 74 is just one example of an electrical connector which may be used; those of skill in the art will readily understand that many other types of electrical connectors may be substituted for the specific electrical connector shown without departing from the scope of the presents invention. In one example, first electrical connector 74 may be a male electrical connector that is configured to couple to a female electrical connector of another module 12, or vice versa. First electrical connector 74 may support any type of electrical communication, e.g., RS-485, RS-232, universal serial bus (USB), or other communication that is or will be known to those of skill in the art.

Figure 11:
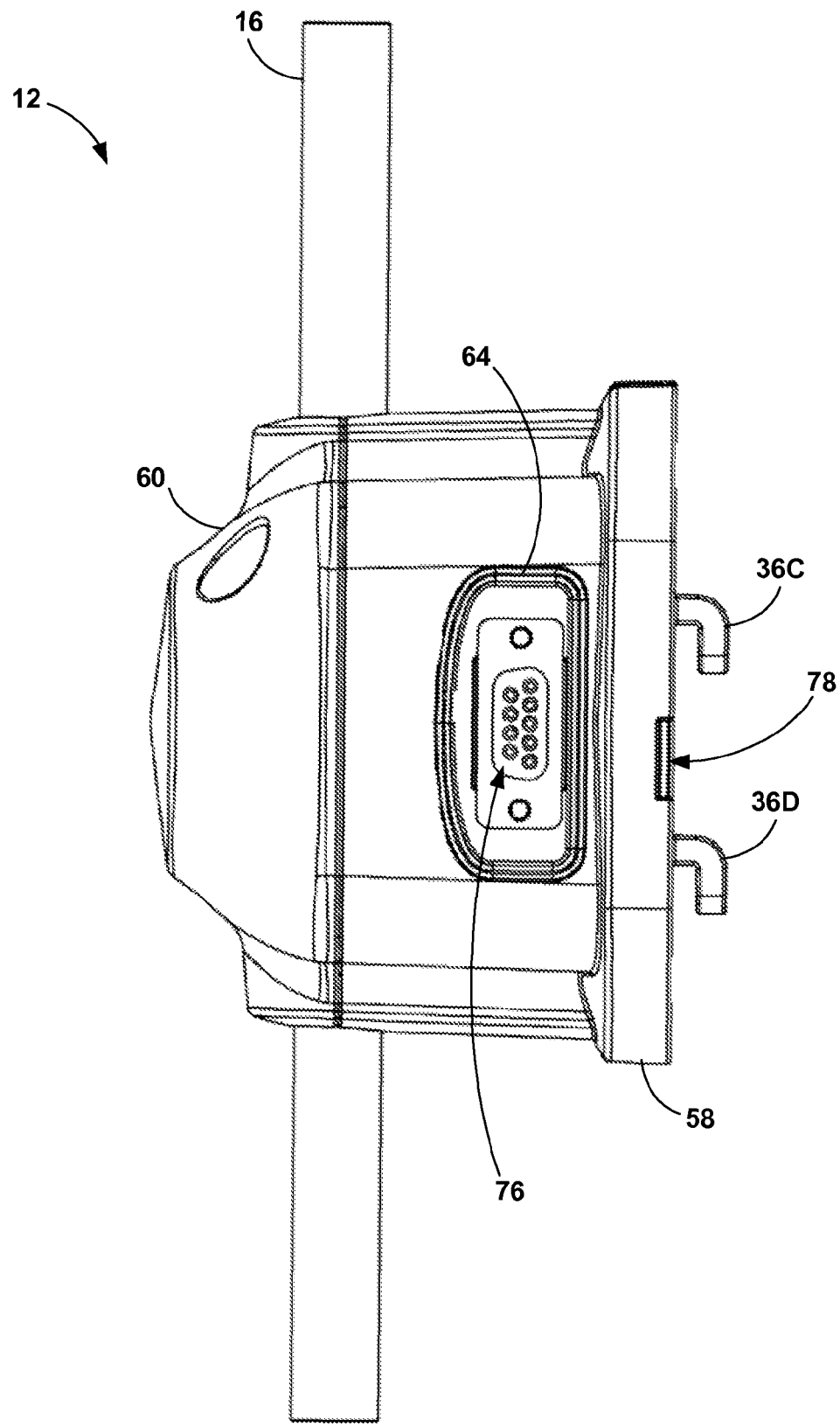
FIG. 11 is a conceptual diagram illustrating a right view of an example module with mounting brackets.

Mounting brackets 36 are attached to base 58 and configured to be inserted within insertion slots of a module mount 24 and translated along translation rails of the module mount. Although mounting brackets 36 are shown with ninety degree angle bends, mounting brackets 36 may be configured with differently angled bends. For example, mounting brackets 36 may be configured with a slightly obtuse angle to fit over the translation rails even if there are slight inaccuracies in the dimensions of mounting brackets 36 or the translation rails, or may be configured having some other geometry depending upon the geometry of the translation rails FIG. 11 is a conceptual diagram illustrating a right side view of an example module 12 with mounting brackets 36. As shown in FIG. 11, module 12 includes base 58, housing 60, distal side coupling 64, and mounting brackets 36C and 36D (collectively "mounting brackets 36"). Second module connector 64 is designed to engage with the first module connector 62 of the adjacent module 12. A second electrical connector 76 is part of the electronic device that resides within second module connector 64 and is configured to engage with the first electrical connector within the first module connector of the adjacent module 12. Second electrical connector 76 is just one example of an electrical connector which may be used; those of skill in the art will readily understand that many other types of electrical connectors may be substituted for the specific electrical connector shown without departing from the scope of the presents invention. Second electrical connector 76 may be a female electrical connector that is configured to couple to a male electrical connector of another module 12, similar to electrical connector 74. Second electrical connector 76 may support any type of electrical communication, e.g., RS-485, RS-232, universal serial bus (USB), or other communication that is or will be known to those of skill in the art.

Ratchet tooth 78 is formed in base 58 of module 12 and is configured to mate with teeth 48 of locking tab 28 when module 12 is coupled to the end module mount 24G. When module 12 is not the distal most end module, ratchet tooth 78 may not be used.

Figure 12:
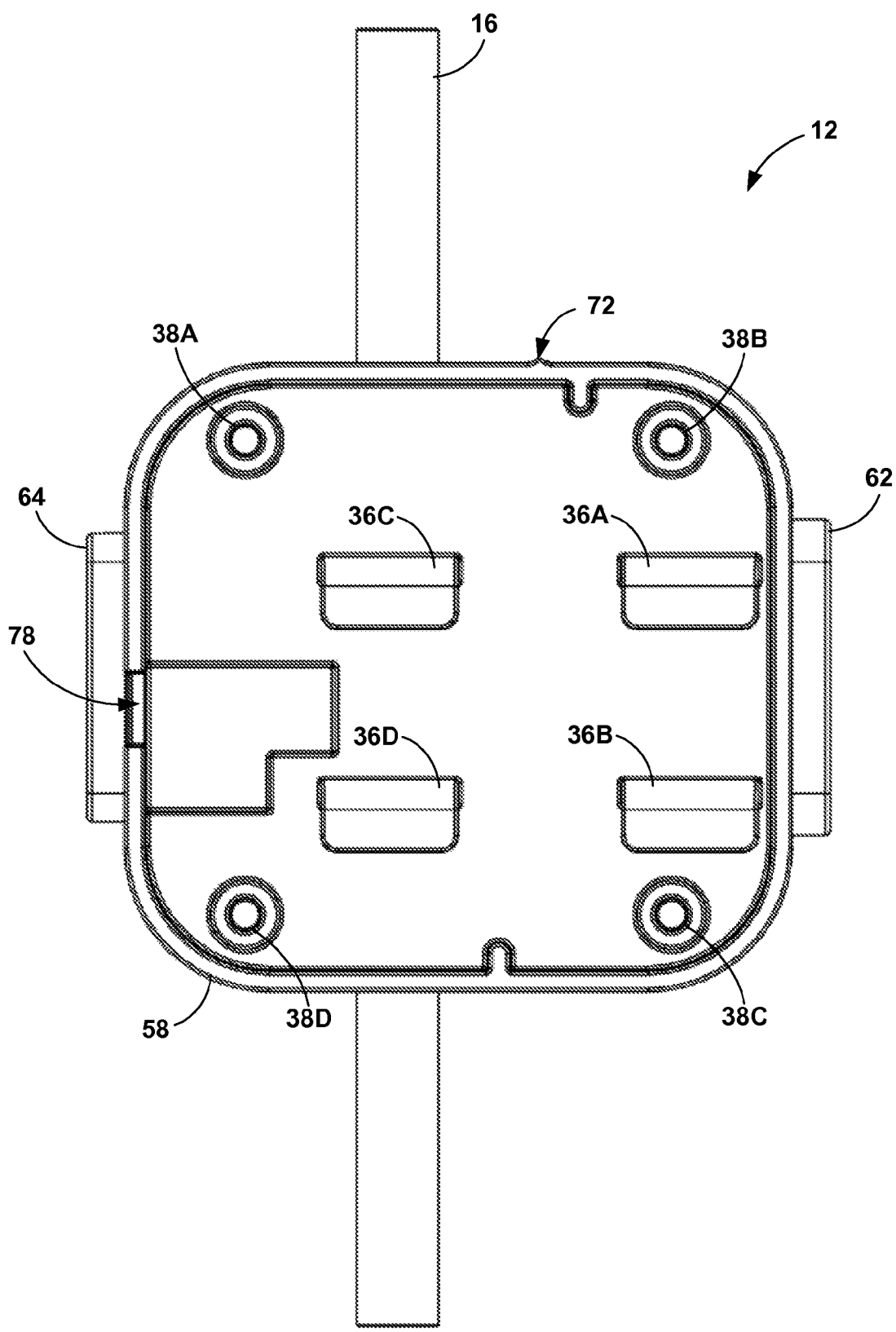
FIG. 12 is a conceptual diagram illustrating a back view of an example module.

FIG. 12 is a conceptual diagram illustrating a back view of an example module 12. As shown in FIG. 12, module 12 includes base 58, first module connector 62, second module connector 64, position indicator 72, and ratchet tooth 78. In addition, module 12 includes mounting holes 38A, 38B, 38C, and 38D (collectively "mounting holes 38") and mounting brackets 36. Although module 12 includes four mounting brackets 36, module 12 may include any number of mounting brackets required to couple with an associated module mount 24.

Figure 13:
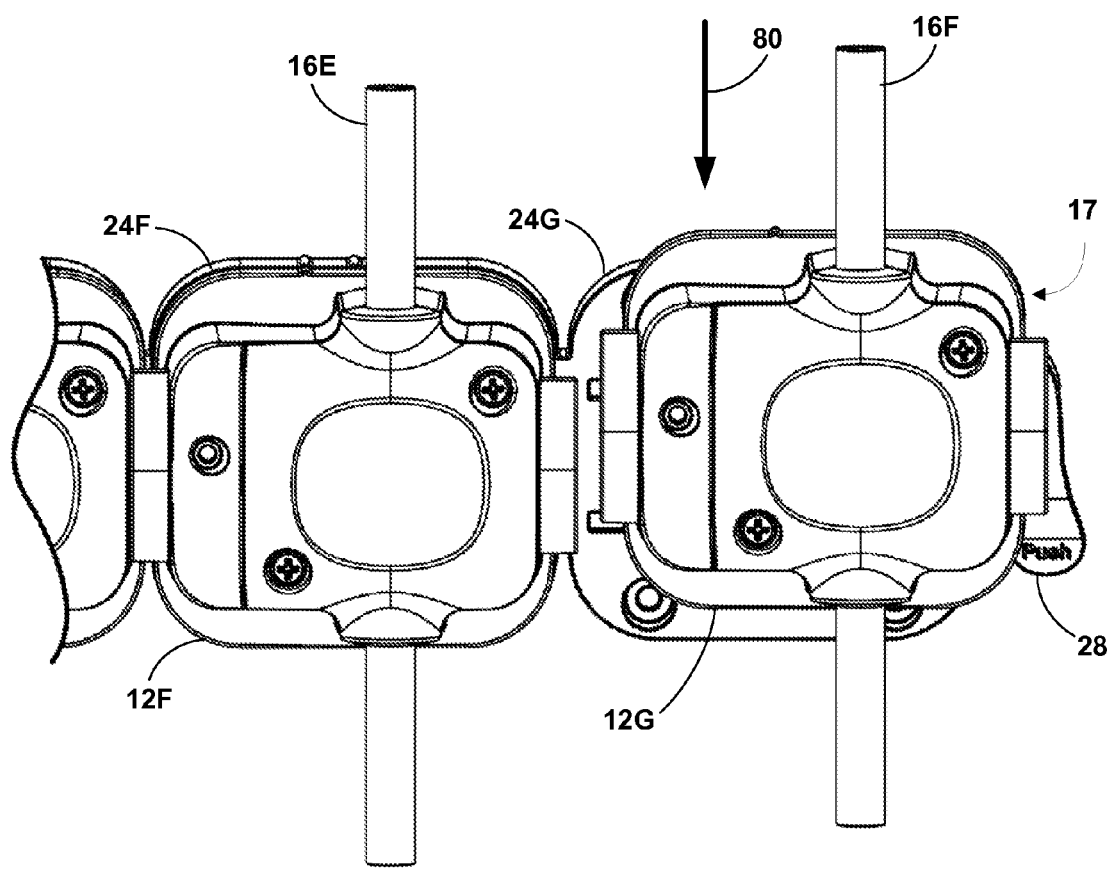
FIG. 13 is a conceptual diagram illustrating an example method of coupling a module to a module mount.

FIG. 13 is a conceptual diagram illustrating an example of how module 12G may be coupled to end module mount 24G. The movement of module 12G is representative of any module 12 and any module mount 24. As shown in FIG. 13, module 12F is already installed on module mount 24F and engaged with its proximally adjacent module partially shown in FIG. 13. The mounting brackets (not visible in FIG. 13) of module 12G have been inserted into the insertion slots of module mount 24G.

Module 12G slides against the front of module mount 24G in the direction indicated by arrow 80 until the mounting brackets of module 12G retain the translation rails of module mount 24G between the mounting brackets and the base of module 12G. In this position, module 12G may be attached to module mount 24G but is not yet engaged with the immediately preceding, proximally adjacent module 12F. Although delivery line 16F is shown as attached to module 12G when module 12G is being coupled to module mount 24G, delivery line 16F may be attached to module 12G after module 12G is coupled to module mount 24G and engaged to module 12F.

Figure 14:
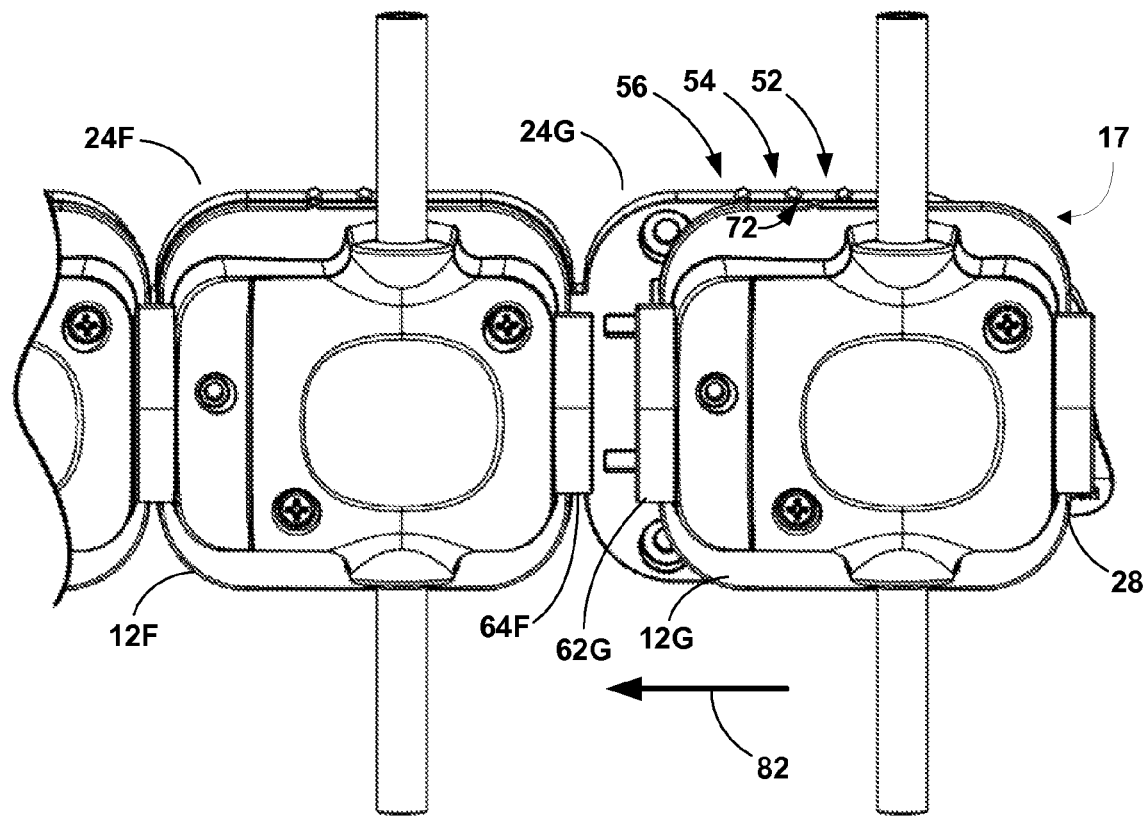
FIG. 14 is a conceptual diagram illustrating an example method of engaging one module to an adjacent module.

FIG. 14 is a conceptual diagram illustrating an example of module 12G in the process of being engaged with adjacent module 12F. The movement of module 12G is representative of any module 12. As shown in FIG. 14, module 12G is attached to module mount 24G via mounting brackets (not shown) that retain the translation rails (not shown) of module mount 24G. When module 12 is first inserted onto translation rails, position indicator 72 of module 12G aligns with removal position 54, which is the position in which the mounting brackets are aligned with the insertion slots of module mount 24G.

In order for module 12G to be engaged with adjacent module 12F, module 12G is translated in the engagement direction toward the immediately preceding adjacent module (in this case, the proximal direction) indicated by arrow 82. Module 12G is translated in the engagement direction until position indicator 72 is substantially aligned with engage position indicator 56 of module mount 24G. In this position, first module connector 62G of module 12G engages with the second module connector 64F of module 12F. Also, when module mount 24 is end module mount 24G, the teeth 48 of locking tab 28 (shown in FIG. 8) retains module 12G, and other modules 12, engaged with module 12F and within engage position indicator 56.

If module 12G were not the last module to be installed, each subsequent module would be installed onto the mounting bracket in a similar manner. For example, each subsequent module would be attached to a module mount distally adjacent to the module mount to which an immediately preceding module was attached. The module would be translated in the engagement direction (in this example, toward the immediately preceding module) such that the first module connector of each subsequent module engages with the second module connector of the immediately preceding module.

This and other alternatives are contemplated in this disclosure. The movement(s) required to engage a module 12 with a module mount 24 may depend upon various factors, such as the physical geometry of the translation brackets, translation slots, and/or mounting brackets, and may vary without departing from the scope of the present invention.

Figure 15:
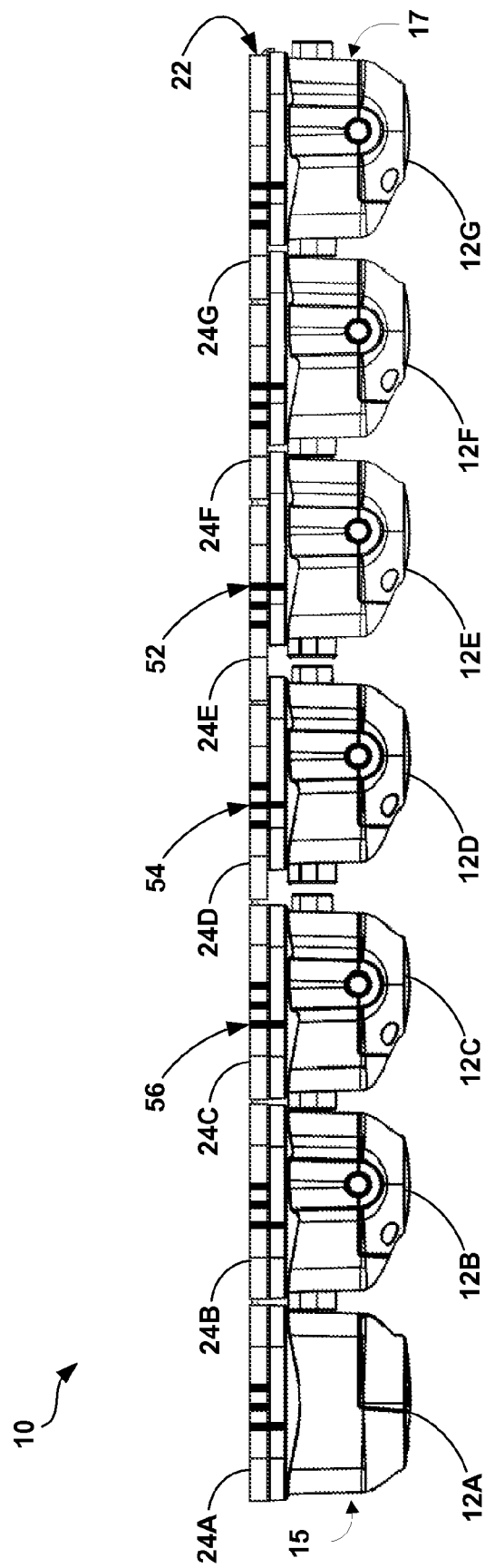
FIG. 15 is a conceptual diagram illustrating a top view of FIG. 15 of an example of removing a middle module.

FIG. 15 is a conceptual diagram illustrating a top view of an example detachable module system, showing removal of a middle module 12D from the plurality of modules 12 attached to mounting plate 22. Module 12D is used as an example, but this removal technique may be used with any module 12.

Once locking tab 28 (not visible in FIG. 15) has been depressed, each of modules 12E, 12F, and 12G may be translated along translation rails in a removal direction (in this example, the distal direction) away from module 12D to their respective disconnect position 52 on module mounts 24E, 24F, and 24G, respectively. Module 12D will thus become disengaged from its distally adjacent module 12E. Then, module 12D is translated along module mount 24D, in the removal direction away from proximally adjacent module 12C to its respective removal position 54. When module 12D is in removal position 54, module 12D is disengaged from both its proximally adjacent module 12C and its distally adjacent module 12E.

Modules 12A, 12B, and 12C remain aligned with engage position indicator 56 because, in this example, these modules do not need to move in order for module 12 D to be removed. The user may then remove module 12D from module mount 24D by decoupling the mounting brackets from the translation rails. After module 12D is removed, either the device within module 12D or the module itself may be repaired and reinstalled, replaced by an entirely new module, or one or more of the modules on the removal side of the removed modules may take its place.

It should be noted that module 12D may be translated in multiple directions along module mount 24D before being removed. For example, the user may first translate all modules 12D, 12E, 12F, and 12G to their respective disconnect position 52. Then, the user may translate module 12D back away from module 12E to removal position 54. In this manner, the user may translate modules 12 in any desired pattern in order to disengage the desired module from the remaining modules.

Figure 16:
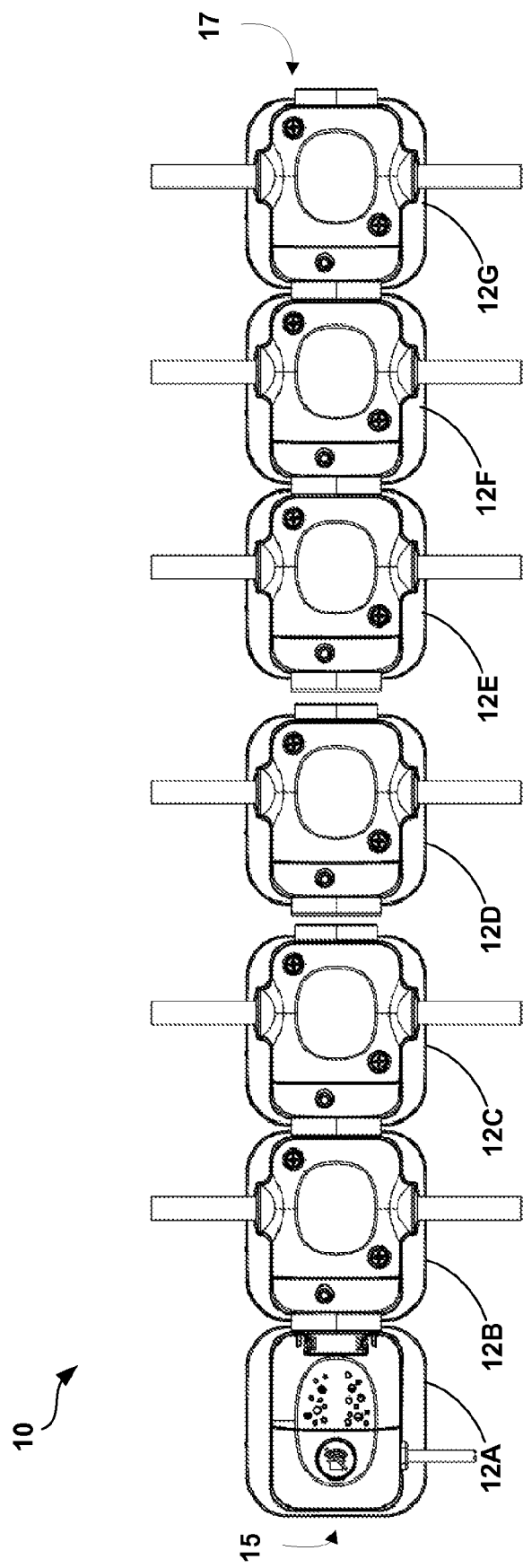
FIG. 16 is a conceptual diagram illustrating a front view of an example module position when removing a middle module.

FIG. 16 is a conceptual diagram illustrating a front view of FIG. 15 when removing a middle module 12D. As shown in FIG. 16, module 12D is separated and disengaged from both its proximally adjacent module 12C and its distally adjacent module 12E. The user may remove module 12D to perform maintenance on module 12D or the device within module 12D before reinstalling module 12D. In some examples, modules 12E, 12F, and 12G may not function when module 12D is removed because they are no longer communitively coupled to the base/control module 12A via the other modules 12B, 12C and 12D. In other examples, modules 12A-12C may continue functioning because they remain in electrical communication with each other. In other examples, the modules need not be connected for the devices housed therein to continue operation.

In another example, 12A, 12B, 12C, 12E, 12F, and 12G, system 10 may be configured such that modules 12E, 12F, and 12G may be removed and re-installed one module mount closer to module 12C. Modules 12E, 12F, and 12G may then continue to be used until module 12D is replaced. Alternatively, a temporary communication bridge (not shown) may be provided to link module 12C to module 12E. This is yet another example of how system 10 may continue to function when module 12D has been removed. The temporary communication bridge may be configured to couple to module mount 24D or simply be held between module 12C and module 12E when module 12 is translated back into the engage position.

Figure 17:
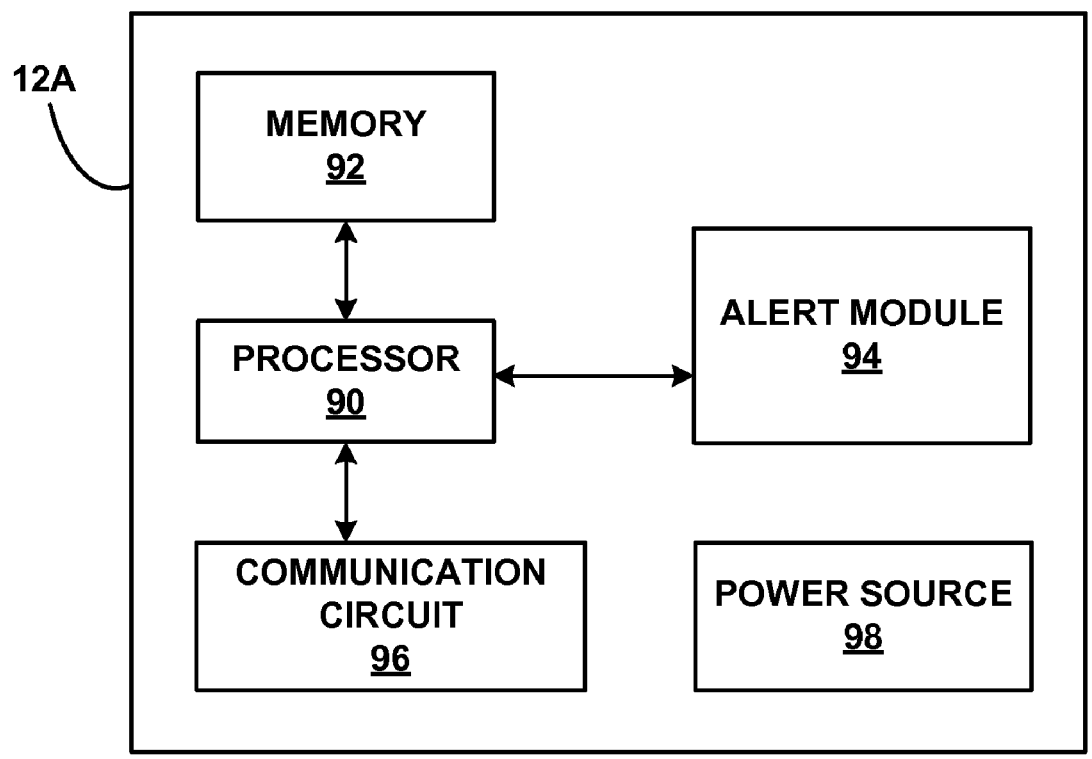
FIG. 17 is a functional block diagram of an example base/control module attached to the mounting plate that controls other modules.

FIG. 17 is a functional block diagram of an example base/control module 12A that controls the other modules 12B-12N of the detachable module system 10. As shown in FIG. 17, base/control module 12A may include, for example, a processor 90, a memory 92, an alert module 94, a communication circuit 96, and a power source 98. Base/control module 12A is configured to control and/or monitor the function of devices within each of the other modules 12 coupled to mounting plate 22. Base/control module 12A may also communicate with remote devices (not shown) via communication circuit 96. Memory 92 may store instructions for execution by processor 90, instructions for controlling modules 12, or data generated by modules 12. Memory 92 may include separate memories for storing different sets of instructions and data, as appropriate for the application of base/control module 12A.

Processor 90 controls the function of base/control module 12A, such as the status of alert module 94. Components described as processors within this disclosure may each comprise one or more processors, such as one or more microprocessors, digital signal processors (DSPs), application specific integrated circuits (ASICs), field programmable gate arrays (FPGAs), programmable logic circuitry, or the like, either alone or in any suitable combination.

Memory 92 may include embedded memory within the circuit board of base/control module 12 and/or removable or programmable memory that may easily be replaced to modify the control instructions for processor 90 and/or increase the storage space for data generated by each module 12. In some cases, memory 92 may operate as a data logger and replace the oldest data with newest data when the storage of memory 92 becomes full. Communications circuit 96 may also allow external devices to retrieve data stored in memory 92, such as material levels, flow rate, pressure, temperature, density, or other relevant system information, depending upon the application.

Alert module 94 includes circuitry that generates one or more alert(s). For example, alert module 94 may include an audible alert, such as a speaker that emits an audible alert when one or more of modules 12 detects absence of fluid within delivery lines 16, or detects some other event relevant to the particular application. Alternatively, or additionally, alert module 94 may include a visual alert, such as a light that turns on or blinks when attention is needed by a user or when a certain event has been detected. The light may be an incandescent bulb, a light emitting diode (LED), or some other visual indicator. In some examples, the particular module 12 that requires attention may include the light to quickly indicate the applicable module 12. Alert module 94 may also include a mute button that turns off an audible alert when pressed by the user. Alternatively or in addition, alert module 94 may initiate and send one or more electronic communications that are remotely sent to an external device such as a networked computer, cell phone, personal digital assistant, pager, or other communication device via e-mail, voice mail, text message, page, etc via communication circuit 96.

Processor 90 may control the function of alert module 94 according to the instructions contained within memory 92. For example, each module 12 may transmit an operating level when requested by processor 90. If the operating level is beyond the normal range stored within memory, then processor 90 may instruct alert module 94 to deliver the alert to the user. In some cases, the alert may be variable depending upon the circumstances. Different flashing patterns or sound frequencies may indicate to the user the type of alert that is being delivered.

Communication circuit 96 includes at least one electrical connector that is configured to engage an adjacent module. Communication circuit 96 may also be capable of network communication with remote devices. For example, an external networking cable may be coupled to communication circuit 96 and allow processor 90 to communicate with an external networked server. The networked server may be capable of disseminating out-of-product alarms to remote devices, such as mobile phones, personal digital assistants, remote computing devices, manufacturer monitoring stations, or any other user that may desire to be notified of the status determined by the device within the module. Processor 90 may also utilize communications circuit 96 to transmit malfunction information and receiving update instructions and override control instructions.

Alternatively, communication circuit 96 may be configured for wireless telemetry with each module 12 and or a networked computing device. In this manner, physical electrical connections may not be required to free up cable routing to and from system 10. For example, communication circuit 96 may support radio frequency communications, e.g., IEEE 802.11 networking, IEEE 802.16 WiMAX networking, CDMA or GSM cellular protocols, or short distance near field communication and Bluetooth, or other wireless communication protocols.

Power source 98 delivers operating power to the components of base/control module 12A and, in some examples, the other modules 12. Power source 98 may utilize alternating current outlets of 110 volts, for example, for applications requiring power for extending periods of time or to control devices requiring more energy to function. Alternatively, power source 98 may be a traditional or rechargeable battery.

Figure 18:
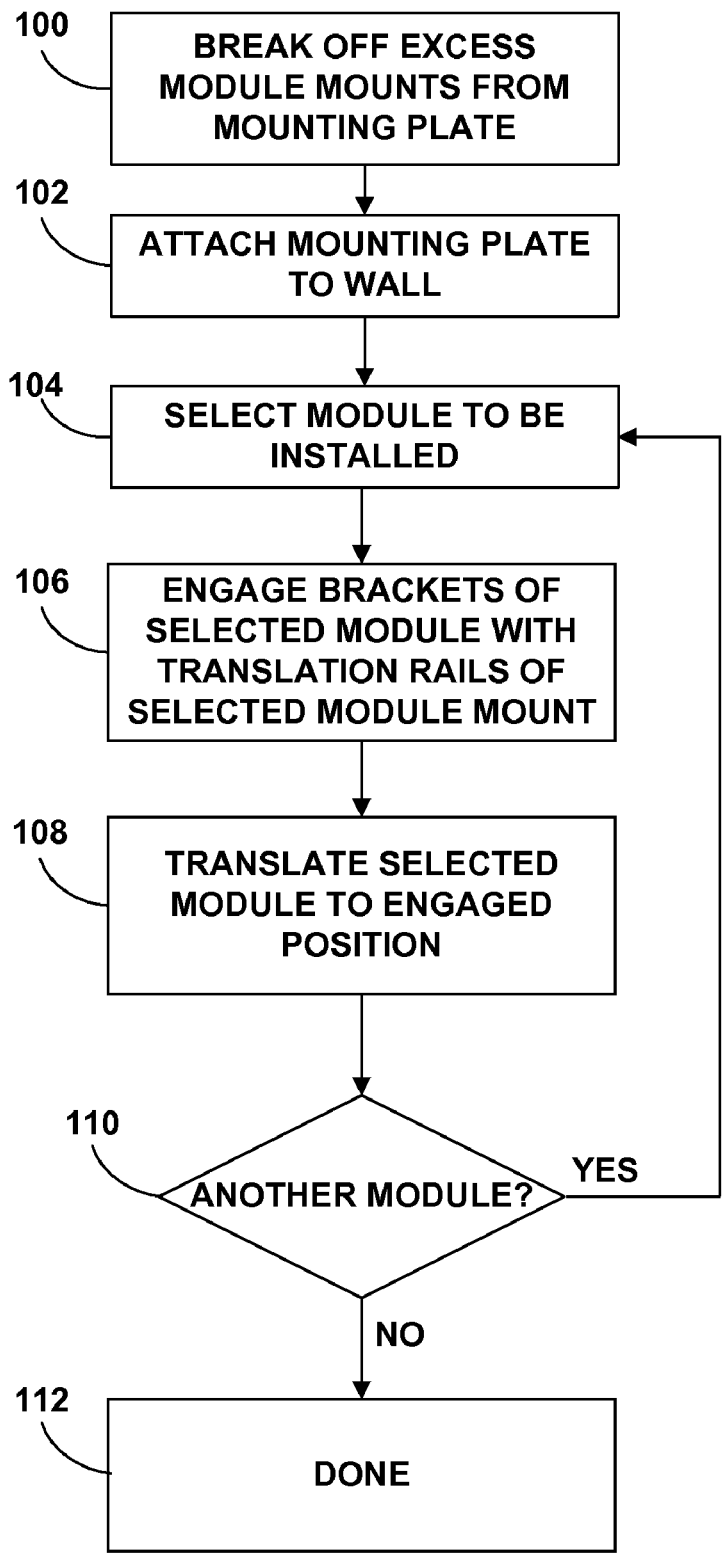
FIG. 18 is a flow diagram illustrating an example technique for attaching modules to a mounting plate.

FIG. 18 is a flow diagram illustrating an example process for attaching one or more modules 12 to mounting plate 22. A user, such as a manufacturer technician, material technician, maintenance worker, service technician, or any other person designated to install system 10 acquires a mounting plate and after determining the number of modules to be installed, breaks off any excess module mounts 24 from the proximal end of the mounting plate such that the determined number of modules mounts 24 remain on the mounting plate 22 (100). Next, the user attaches the mounting plate to the wall or other substrate (102).

Once the mounting plate is attached to the wall, the user selects a module to be installed (104). The user then engages the mounting brackets of the selected module with the translation rails of an adjacent available module mount (in the examples given herein, this corresponds to the proximal-most available module mount) (106). In the case of the first module to be installed, the selected module mount would be the proximal-most module mount on the mounting bracket, e.g., module mount 24A in FIG. 15.

The user translates the module until module is in the engaged position (108). In this example, the selected module is translated across translation rails toward any immediately preceding adjacent module until the position indicator 72 on the selected module is substantially aligned with engaged position indicator 56 on the module mount. The selected module is now coupled to module mount and placed in the engaged position.

If another module is to be installed (110), the user selects the next module to be installed (104). The user then engages the mounting brackets of the selected module with the translation rails of the proximal-most available module mount (106). The user translates the selected module until module is in the engaged position (108). In this example, the selected module is translated along translation rails 34 until position indicator 72 is substantially aligned with engaged position indicator 56 on the selected module mount. In this position, proximal side coupling 62 of the selected module 12 engages with the distal side coupling 64 of the immediately preceding proximally adjacent module.

The installation process is repeated with each subsequent module until all modules have been installed into system 10 (112). At this point in time, the user may connect delivery lines 16 and any other power or communication connections, or may make any other final set up to the system as required by the particular application.

Figure 19:
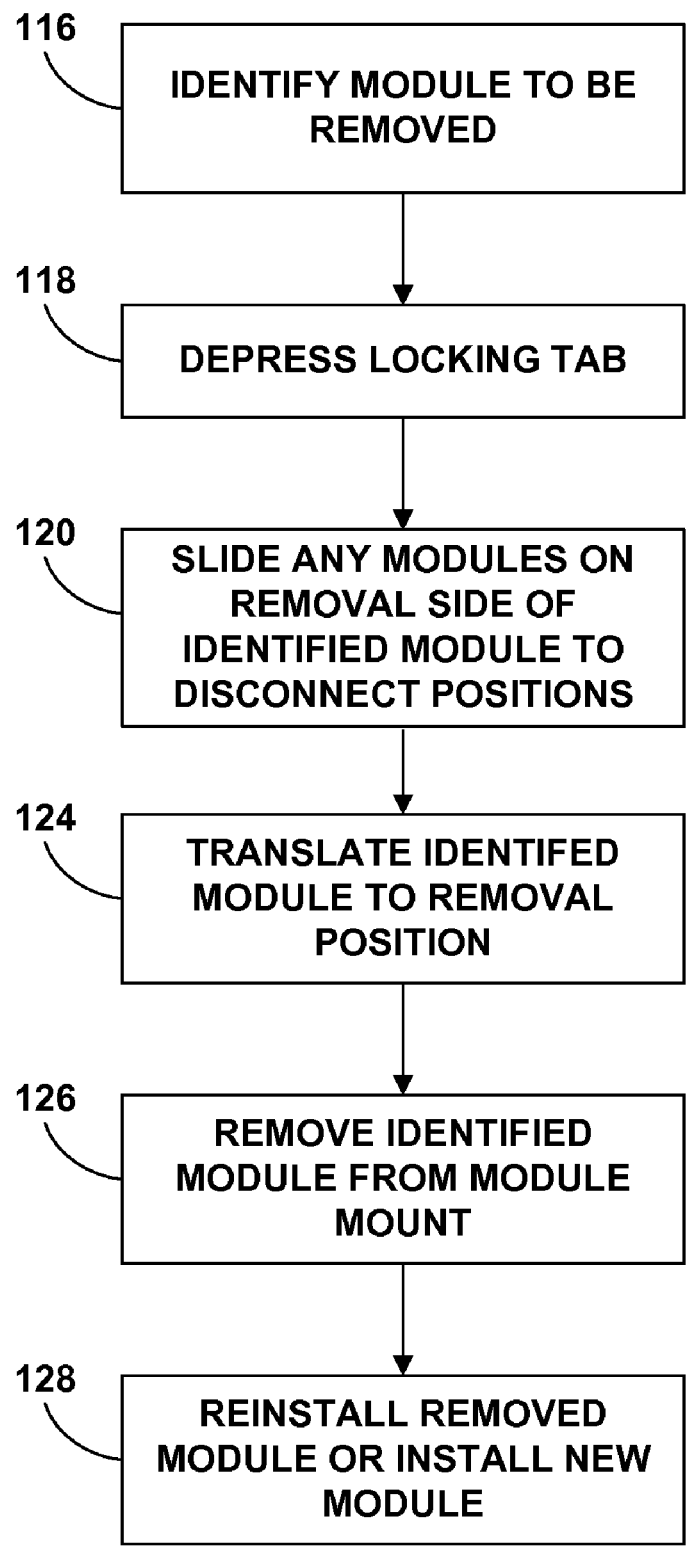
FIG. 19 is a flow diagram illustrating an example technique for removing a dysfunctional module from a mounting plate with a plurality of modules.

FIG. 19 is a flow diagram illustrating an example process for removing a module from mounting plate 22. A module 12 to be removed may be removed because of a malfunction, an update, or for any other reason. For example, a module may be removed for preventative maintenance, to clean out a delivery line, to update a device within the module, etc.

The user first identifies at least one module to be removed (116). Next, the user depresses locking tab 28 on the distal most module mount to allow all modules on the removal side of the identified module (e.g., those between the identified module to be removed and the distal-most module) to be disengaged from the identified module (118). In this manner, teeth 48 are pulled away from the distal-most module. The user then translates the modules on the removal (distal, in this example) side of the identified module to their respective disconnect positions 52 (120). The identified module is then translated to the removal position 54 of the associated module mount (124). The user may then remove the identified module from the module mount (126). At this point, the identified module may be reinstalled, or a new module may be installed, etc. (128). More than one module may be removed from system mounting plate at any given time.

In some examples, any delivery lines 16 associated with a module 12 to be removed may be disconnected from the module 12 before removal. As mentioned previously, system 10 may no longer function, or at least the modules in the disconnect position 52, once one or more modules are removed from mounting plate 22. However, the remaining modules may be moved to different module mounts to be engaged or a communication bridge may be used to allow the remaining modules to be functional until the removed module(s) is/are replaced.

As described herein, the disclosure provides a system that is quickly customizable to the number of desired modules upon installation. Each module is attached to the mounting plate and electrically engaged with each other without the use of any tools. In addition, each module is easily removable from the mounting plate without requiring the complete removal of any of the other modules in the system. This feature may minimize maintenance time and cost over the life of the system. In addition, each of the modules may house a device that interacts with the external material according to commands from the base/control module attached to the mounting plate and/or communicates information to an external device via the base/control module.

Although specific embodiments of a dispenser system have been shown and described, it shall be understood that other embodiments could be substituted therefore without departing from the scope of the present invention. Various embodiments of the invention have been described. These and other embodiments are within the scope of the following claims.

The invention claimed is:

1. A system comprising:
   a mounting plate including a plurality of module mounts arranged linearly from a proximal end of the mounting plate to a distal end of the mounting plate; and
   a plurality of modules, each configured to attach to any one of the plurality of module mounts, and each including a first module connector oriented toward the proximal end of the mounting plate and a second module connector oriented toward the distal end of the mounting plate when each module is attached to a respective module mount,
   each module mount further including an engage position indicator, a removal position indicator, and a disconnect position indicator;
   each module further including a position indicator that aligns with any one of engage position indicator, removal position indicator, and disconnect position indicator of the respective module mount and indicates whether the module is in one of an engage position, a removal position, or a disconnect position with respect to the module mount;

wherein a first one of the plurality of modules attaches to a first one of the plurality of module mounts at the proximal end of the mounting plate, and a second one of the plurality of modules attaches to a second one of the plurality of module mounts distally adjacent to the first module mount such that the first module connector of the second module engages with the second module connector of the first module.

2. The system of claim 1 wherein each subsequent one of the plurality of modules attaches to a module mount distally adjacent to a module mount to which an immediately preceding one of the plurality of modules was attached.

3. The system of claim 2 wherein the first module connector of each subsequent module engages with the second module connector of a proximally adjacent module.

4. The system of claim 1 wherein each of the plurality of module mounts comprises at least one insertion slot, at least one translation channel, and at least one translation rail adjacent to the at least one translation channel.

5. The system of claim 4 wherein each of the plurality of modules comprises a mounting bracket that is configured to be inserted into the at least one insertion slot.

6. The system of claim 1 wherein at least one of the plurality of module mounts is detachable from the mounting plate.

7. The system of claim 1 wherein at least one of the plurality of module mounts detach from the proximal end of the mounting plate until a desired number of module mounts remain on the mounting plate.

8. The system of claim 1 wherein the second module connector of the first module engages the first module connector of the second module when the second module is translated toward the proximal end of the mounting plate.

9. The system of claim 1 wherein at least one of the plurality of modules houses at least one electronic device.

10. The system of claim 7 wherein the at least one electronic device is one of an optical sensor, a pump, a valve, a mechanical sensor, a chemical sensor, a treatment system, a filter, and a mixer.

11. The system of claim 7 wherein the at least one electronic device is an out of product sensor that determines presence or absence of a fluid in a fluid delivery medium.

12. The system of claim 11 wherein each electronic device includes a first electrical connector aligned with the first module connector and a second electrical connector aligned with the second module connector such that when the first module connector and the second module connector engage the first electrical connector and the second electrical connector are physically connected to permit electronic communication between the electronic devices housed within the respective modules.

13. The system of claim 1 wherein at least one of the plurality of modules is a base/control module that controls each of the plurality of modules.

14. The system of claim 1 wherein the plurality of modules and the mounting plate are constructed of at least one of polypropylene, polyethylene, polyurethane, polystyrene, nylon, a composite material, and a metal alloy.

15. The system of claim 1 wherein the mounting plate mounts to a substrate.

16. The system of claim 1 wherein a module mount at the distal end of the mounting plate includes a locking tab that substantially prevents movement of the plurality of modules attached to their respective module mounts.

17. The system of claim 16 wherein each module includes a locking mechanism that engages with the locking tab when the module is attached to the module mount at the distal end of the mounting plate.

18. The system of claim 1, wherein each module is configured to be translated along the respective module mount from the engage position to the disengage position.

19. A method comprising:
attaching a first one of a plurality of modules to a first one of a plurality of module mounts linearly arranged on a mounting plate; and
successively attaching each remaining one of the plurality of modules to an available module mount adjacent to a module mount to which an immediately preceding module was attached,
wherein successively attaching further comprises translating each remaining module toward an immediately preceding adjacent module such that each successive module is engaged with the immediately preceding adjacent module;
identifying one of the plurality of modules to be removed from the mounting plate;
translating modules on a removal side of the identified module to a disconnect position relative to their respective module mounts;
translating the identified module to a removal position relative to its respective module mount; and
removing the identified module from its respective module mount without removing modules on the removal side of the identified module from their respective module mounts.

20. The method of claim 19, further comprising:
reattaching the identified module to the module mount from which it was removed; and translating the modules on the removal side of the identified module to an engaged position relative to their respective module mounts.

21. The method of claim 19, further comprising:
attaching a new module to the module mount from which the identified module was removed; and
translating the modules on the removal side of the identified module to an engaged position relative to their respective module mounts.

22. The method of claim 19 further comprising attaching the mounting plate to a substrate.

23. The method of claim 19, further comprising electrically communicating between successive modules.

24. A module comprising:
a housing having a base that rests against a mounting plate, the mounting plate having at least one translation channel and at least one translation rail, the mounting plate further including an engage position indicator, a removal position indicator, and a disconnect position indicator,
the housing further including a position indicator that aligns with any one of engage position indicator, removal position indicator, and disconnect position indicator of the mounting plate and indicative of whether the housing is in one of an engage position, a removal position, or a disconnect position with respect to the module mount;
at least one mounting bracket that extends from the base, retains the at least one translation rail and slides within the translation channel such that the module slides between the engage position, the removal position and the disconnect position;
a first module connector disposed on a first side of the module housing; and a second module connector disposed on a second side of the module housing, wherein the first module connector is sized to engage with the second module connector of an adjacent module mounted to the mounting plate.

25. The system of claim 1, wherein each module is configured to be translated along the respective module mount from the engage position to the removal position.

26. A system comprising:
a mounting plate including a plurality of module mounts arranged linearly from a proximal end of the mounting plate to a distal end of the mounting plate, each module mount configured to form a module engage position, a module removal position, and a module disconnect position; and
a plurality of modules, each configured to attach to any one of the plurality of module mounts, and each including a first module connector oriented toward the proximal end of the mounting plate and a second module connector oriented toward the distal end of the mounting plate when each module is attached to a respective module mount,
each module further configured to translate along its respective module mount between the module engage position, the module removal position and the module disconnect position;
wherein a first one of the plurality of modules attaches to a first one of the plurality of module mounts at the proximal end of the mounting plate, and a second one of the plurality of modules attaches to a second one of the plurality of module mounts distally adjacent to the first module mount such that the first module connector of the second module engages with the second module connector of the first module when the first and second modules are in the module engaged position relative to the respective module mount.

27. A system comprising
a mounting plate including a plurality of module mounts arranged linearly from a proximal end of the mounting plate to a distal end of the mounting plate; and
a first module positioned in an engage position in a first module mount;
a second module positioned in a removal position in a second module mount distally adjacent to the first module mount; and
a third module positioned in a disconnect position in a third module mount distally adjacent to the second module mount;
such that the second module may be removed from the second module mount without removing the first module from the first module mount or removing the third module from the third module mount.

* * * * *